United States Patent
Yasuhara et al.

(10) Patent No.: US 8,822,972 B2
(45) Date of Patent: Sep. 2, 2014

(54) NON-VOLATILE MEMORY ELEMENT AND MANUFACTURING METHOD THEREOF

(71) Applicant: Panasonic Corporation, Osaka (JP)

(72) Inventors: Ryutaro Yasuhara, Osaka (JP); Takeki Ninomiya, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/038,623

(22) Filed: Sep. 26, 2013

(65) Prior Publication Data
US 2014/0117305 A1 May 1, 2014

(30) Foreign Application Priority Data

Sep. 26, 2012 (JP) ................................. 2012-211751

(51) Int. Cl.
*H01L 47/00* (2006.01)
*H01L 45/00* (2006.01)

(52) U.S. Cl.
CPC .......... *H01L 45/146* (2013.01); *H01L 45/1608* (2013.01)
USPC ................. 257/4; 257/1; 257/2; 257/E45.002; 438/104; 438/382

(58) Field of Classification Search
CPC ............ H01L 45/1608; H01L 45/1675; H01L 45/1683
USPC .......... 257/1–5, E45.002, E21.006, E45.003, 257/E47.001; 438/104, 382; 365/148
See application file for complete search history.

(56) References Cited

U.S. PATENT DOCUMENTS

| | | |
|---|---|---|
| 2009/0283736 A1 | 11/2009 | Kanzawa et al. |
| 2010/0308298 A1 | 12/2010 | Ninomiya et al. |
| 2011/0001110 A1 | 1/2011 | Takahashi |
| 2011/0002154 A1 | 1/2011 | Mitani et al. |
| 2011/0294259 A1 | 12/2011 | Kanzawa et al. |
| 2013/0037775 A1 | 2/2013 | Mitani et al. |
| 2013/0119344 A1 | 5/2013 | Mikawa et al. |

FOREIGN PATENT DOCUMENTS

| | | |
|---|---|---|
| JP | 2010-251352 A | 11/2010 |
| WO | 2008-149484 A1 | 12/2008 |
| WO | 2009125777 A1 | 1/2009 |
| WO | 2010-004705 A1 | 1/2010 |
| WO | 2010038423 A1 | 4/2010 |
| WO | 2012-046454 A1 | 4/2012 |

OTHER PUBLICATIONS

Japanese Office Action issued in Japanese Application No. 2013-198007 dated Apr. 22, 2014.

*Primary Examiner* — Mark A Laurenzi
(74) *Attorney, Agent, or Firm* — McDermott Will & Emery LLP

(57) ABSTRACT

A non-volatile memory element including a first electrode; a second electrode; and a variable resistance layer. The variable resistance layer including, when a first metal is M and a second metal is N: a third metal oxide layer $NO_z$; a second metal oxide layer $NO_y$; and a first metal oxide layer $MO_x$ such that the third, second and first metal oxide layers are stacked in this order; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

11 Claims, 11 Drawing Sheets

(TOTAL OF TWO LAYERS 30nm)

(TOTAL OF THREE LAYERS 50nm)

US 8,822,972 B2

NON-VOLATILE MEMORY ELEMENT AND MANUFACTURING METHOD THEREOF

CROSS-REFERENCE TO RELATED PATENT APPLICATION

The application claims priority to Japanese Patent Application No. 2012-211751, filed on Sep. 26, 2012, the entire disclosure of which is incorporated herein by reference.

BACKGROUND OF THE INVENTION

1. Field of the Invention

The present invention relates to a non-volatile memory element and a manufacturing method thereof. More particularly, the present invention relates to a variable resistance non-volatile memory element which changes its resistance value in response to an electric signal applied thereto.

2. Description of the Related Art

In recent years, with progresses of digital technologies, electronic devices such as portable information devices and information home electric appliances have been developed to provide higher functionalities. With achievement of the higher functionalities of these electronic devices, further miniaturization and higher-speeds of semiconductor elements incorporated into these electronic devices have been progressing at a high pace. Among them, use of a high-capacity non-volatile memory, which is represented by a flash memory, has been expanding at a high pace. Furthermore, as a novel non-volatile memory in a next generation which has a potential of replacing this flash memory, research and development of a variable resistance non-volatile memory device including a variable resistance element has been progressing. The variable resistance element refers to an element having a characteristic in which it reversibly changes its resistance value in response to an electric signal and being able to store information corresponding to the changed resistance value in a non-volatile manner.

International Publication No. 2008/149484 discloses a non-volatile memory element including a first electrode, a second electrode, and a variable resistance layer which is interposed between the first electrode and the second electrode and reversibly changes its resistance value in response to electric signals which are different in polarity from each other and are applied between these electrodes, the variable resistance layer including, in a thickness direction thereof, a first region comprising a first oxygen-deficient tantalum oxide having a composition expressed as $TaO_x$ ($0<x<2.5$), and a second region comprising a second oxygen-deficient tantalum oxide having a composition expressed as $TaO_y$ ($x<y<2.5$).

Japanese Laid-Open Patent Application Publication No. 2010-251352 discloses a non-volatile memory element including a first electrode, a second electrode, and a variable resistance layer which is interposed between the first electrode and the second electrode and reversibly changes its resistance value in response to an electric signal applied between these electrodes, the variable resistance layer having a structure in which a first transition metal oxide layer having a composition expressed as $MO_x$ (M is transition metal, and O is oxygen), a second transition metal oxide layer having a composition expressed as $MO_y$ ($x>y$), and a third transition metal oxide layer having a composition expressed as $MO_z$ ($y>z$) are stacked in this order.

SUMMARY OF THE INVENTION

The conventional non-volatile memory device has a problem that there is non-uniformity of characteristics of non-volatile memory elements.

The present invention addresses the above stated problem associated with the prior art, and an object is to lessen non-uniformity of the characteristics of the non-volatile memory elements.

According to one aspect of a non-volatile memory element of the present invention, comprises a first electrode; a second electrode; and a variable resistance layer which is interposed between the first electrode and the second electrode, and reversibly changes its resistance value in response to an electric signal applied between the first electrode and the second electrode; the variable resistance layer including, when a first metal is M and a second metal is N: a third metal oxide layer having a composition expressed as $NO_z$; a second metal oxide layer having a composition expressed as $NO_y$; and a first metal oxide layer having a composition expressed as $MO_x$ such that the third metal oxide layer, the second metal oxide layer and the first metal oxide layer are stacked in this order; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

According to one aspect of a non-volatile memory element of the present invention, comprises a first electrode; a second electrode; and a variable resistance layer which is interposed between the first electrode and the second electrode, and reversibly changes its resistance value in response to an electric signal applied between the first electrode and the second electrode; the variable resistance layer including a third metal oxide layer comprising a third metal oxide, a second metal oxide layer comprising a second metal oxide, and a first metal oxide layer comprising a first metal oxide such that the third metal oxide layer, the second metal oxide layer and the first metal oxide layer are stacked in this order; and wherein a resistivity of the second metal oxide is lower than a resistivity of the first metal oxide and is lower than a resistivity of the third metal oxide, and the resistivity of the third metal oxide is lower than the resistivity of the first metal oxide.

According to one aspect of a method of manufacturing a non-volatile memory element, of the present invention, comprises, when a first metal is M and a second metal is N, the steps of: forming a second electrode; forming a third metal oxide layer having a composition expressed as $NO_z$, on and above the second electrode; forming a second metal oxide layer having a composition expressed as $NO_y$, on and above the third metal oxide layer; forming a first metal oxide having a composition expressed as $MO_x$, on and above the second metal oxide layer; and forming a first electrode on and above the first metal oxide layer, at least the second metal oxide layer and the third metal oxide layer being deposited by reactive sputtering in an oxygen atmosphere; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

According to one aspect of a method of manufacturing a non-volatile memory element, of the present invention, comprises, when a first metal is M and a second metal is N, the steps of: forming a first electrode; forming a first metal oxide layer having a composition expressed as $MO_x$, on and above the first electrode; forming a second metal oxide layer having a composition expressed as $NO_y$, on and above the first metal oxide layer; forming a third metal oxide layer having a composition expressed as $NO_z$, on and above the third metal oxide layer; and forming a second electrode on and above the third metal oxide layer, at least the first metal oxide layer, the second metal oxide layer and the third metal oxide layer being deposited by reactive sputtering in an oxygen atmosphere; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

According to one aspect of the present invention, non-uniformity of characteristics of non-volatile memory elements can be lessened.

Figure 1:
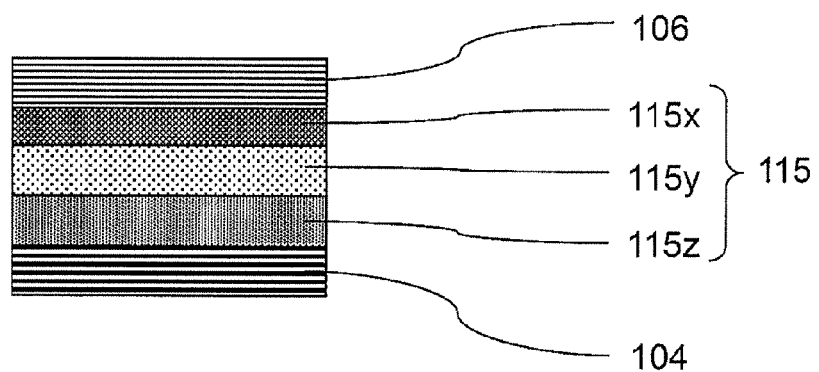
FIG. 1 is a cross-sectional view showing an exemplary schematic configuration of a non-volatile memory element according to Embodiment 1.

DETAILED DESCRIPTION OF THE PREFERRED EMBODIMENTS (Results of Study)

The present inventors intensively studied to improve a performance of a non-volatile memory element (variable resistance element), and discovered the followings.

In recent years, lower electric consumption of the non-volatile memory element has been demanded. Particularly, electric power consumption required to write information to the non-volatile memory element has been demanded.

As defined herein, a current (e.g., current flowing after the element has changed its resistance state when a voltage pulse is applied) flowing through a variable resistance layer during a write operation for changing the resistance state of the element, will be referred to as a switching current. In addition, as defined herein, a current flowing through the variable resistance layer when a particular voltage (read voltage) is applied to the variable resistance element to read the resistance state of the element, will be referred to as a read current.

The present inventors found out that, in the conventional non-volatile memory element described in background art, there is a positive correlation between the switching current flowing when the non-volatile memory element changes to the low-resistance state (resistance state of the element is changed from the high-resistance state to the low-resistance state) and the read current corresponding to the low-resistance state (when the non-volatile memory element is in the low-resistance state). Specifically, if the switching current for changing the non-volatile memory element to the low-resistance state is reduced to reduce electric power consumption, the read current corresponding to the low-resistance state is reduced. Because of this, a difference between the read current corresponding to the low-resistance state and the read current corresponding to the high-resistance state is reduced. This makes it difficult to determine whether the element is in the low-resistance state or in the high-resistance state. As a result, a read error is more likely to occur.

In order to address such a problem, the present inventors discovered that non-uniformity of resistance values of the elements in the low-resistance state can be lessened by a configuration in which the variable resistance layer includes, when a first metal is M and a second metal is N, a third metal oxide layer having a composition expressed as $NO_z$, a second metal oxide layer having a composition expressed as $NO_y$, and a first metal oxide layer having a composition expressed as $MO_x$ such that the third metal oxide layer, the second metal oxide layer and the first metal oxide layer are stacked in this order, and (D/B)<(C/A), (E/B)<(C/A) and y<z are satisfied, when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D and an oxygen content atomic percentage of $NO_z$ is E.

It was estimated such a phenomenon occurs by a mechanism as follows. By applying an electric signal to the variable resistance layer, oxygen ions migrate within the variable resistance layer. This results in formation of a region which is lower in oxygen concentration, extending from an interface between the first metal oxide layer and the electrode toward an inner portion of the variable resistance layer, which causes the non-volatile memory element to change to the low-resistance state. A length and the like of this region significantly affects the resistance value of the element in the low-resistance state.

In some cases, the region which is lower in oxygen concentration extends to the second metal oxide layer through the first metal oxide layer. However, this region is less likely to extend further beyond a point at which its tip end contacts a layer which is higher in oxygen concentration. By placing the third metal oxide layer which is higher in oxygen content atomic percentage than the second metal oxide layer, as a layer which is disposed beyond the second metal oxide layer, in a direction in which the region which is lower in oxygen concentration extends, a site where the region which is lower in oxygen concentration is formed can be limited to a particular region. As a result, the length and the like of the region which is lower in oxygen concentration can be made uniform, and hence non-uniformity of resistance values of the elements in the low-resistance state can be lessened.

It is estimated that even when another metal oxide layer is placed as a layer which is disposed further beyond the third metal oxide layer, the same advantages can be achieved so long as the third metal oxide layer which is higher in oxygen content atomic percentage than second metal oxide layer is placed as the layer which is disposed beyond the second metal oxide layer.

[Terms]

The term "degree of oxygen deficiency" refers to a ratio of oxygen deficiency with respect to an amount of oxygen constituting an oxide having a stoichiometric composition (stoichiometric composition corresponding to a greatest resistance value in a case where there exist plural stoichiometric compositions) of each metal oxide. For example, in a case where metal is tantalum (Ta), a stoichiometric composition of an oxide of tantalum is $Ta_2O_5$, and therefore is expressed as $TaO_{2.5}$. The degree of oxygen deficiency of $TaO_{2.5}$ is 0%. For example, the degree of oxygen deficiency of an oxygen-deficient tantalum oxide having a composition of $TaO_{1.5}$, is (2.5−1.5)/2.5=40%. An oxygen excess metal oxide has a negative value in degree of oxygen deficiency. In the present specification, the degree of oxygen deficiency is meant to include a positive value, 0 and a negative value unless otherwise explicitly noted.

The term "oxygen-deficient metal oxide" means a metal oxide which is less in oxygen content (atomic ratio: ratio of the number of oxygen atoms to the total number of atoms) than a metal oxide in the stoichiometric state (having a stoichiometric composition).

The term "metal oxide in the stoichiometric state" refers to a metal oxide which is 0% in degree of oxygen deficiency. For example, in the case of the tantalum oxide, the metal oxide in the stoichiometric state refers to $Ta_2O_5$ which is an insulator. The oxygen-deficient metal oxide is allowed to have an electric conductivity, because of its oxygen deficiency. Typically, an oxide which is lower in degree of oxygen deficiency is closer to the oxide in the stoichiometric state and therefore has a greater resistance value, while an oxide which is higher in degree of oxygen deficiency is closer to a metal constituting the oxide and therefore has a smaller resistance value.

The term "oxygen content atomic percentage" refers to a ratio of the number of oxygen atoms contained in the metal oxide to the total number of atoms constituting the metal oxide. The oxygen content atomic percentage of $Ta_2O_5$ is the ratio of the number of oxygen atoms to the total number of atoms (O/(Ta+O)) and is 71.4%. Therefore, the oxygen content atomic percentage of the oxygen-deficient tantalum oxide is higher than 0 and lower than 71.4%. In a case where the metal constituting the first metal oxide and the metal constituting the second metal oxide are of the same kind, a magnitude relationship of the degree of oxygen deficiency can be expressed as the oxygen content atomic percentage. For example, when the degree of oxygen deficiency of the first metal oxide is higher than the degree of oxygen deficiency of the second metal oxide, the oxygen content atomic percentage of the first metal oxide is lower than the oxygen content atomic percentage of the second metal oxide.

The term "insulator" may be defined as a general one. That is, the insulator is meant to comprise a material having a resistivity of $10^8$ Ωcm or greater (Non-patent literature: presented "Semiconductor engineering for integrated circuit" industry search committee (1992), Akira Usami, Shinji Kanefusa, Takao Maekawa, Hajime Tomokage, Morio Inoue). By comparison, the term "electric conductor" refers to an element comprising a material having a resistivity which is less than $10^8$ Ωcm. It should be noted that before execution of an initial breakdown operation occurs, there is a difference of 4-digit to 6-digit numeric value or more between the resistivity of the first metal oxide and the resistivity of the third metal oxide. The resistivity of the variable resistance element after execution of the initial breakdown operation is, for example, about $10^4$ Ωcm.

The term "standard electrode potential" refers to a degree to which a material is easily oxidated. As a value of the standard electrode potential is greater, the corresponding material is less easily oxidated, while as a value of the standard electrode potential is smaller, the corresponding material is more easily oxidated. As a difference in standard electrode potential from that of a layer which is lower in degree of oxygen deficiency, of layers which are in contact with electrodes, is greater, a redox reaction more easily occurs, and resistance change more easily occurs. Also, as the difference in standard electrode potential is smaller, the redox reaction less easily occurs, and resistance change less easily occurs. Therefore, it is estimated that the degree to which the material is easily oxidated has an important role in a mechanism of a resistance changing phenomenon.

The term "relative content rate of oxygen" refers to a ratio of an oxygen content atomic percentage of the corresponding oxide with respect to an oxygen content atomic percentage of an oxide in a stoichiometric state. For example, a tantalum oxide in the stoichiometric state is $Ta_2O_5$, while a hafnium oxide in the stoichiometric state is $HfO_2$. The oxygen content atomic percentage of $Ta_2O_5$ is 2.5, while the oxygen content atomic percentage of $HfO_2$ is 2. The oxygen content atomic percentage of $TaO_2$ and the oxygen content atomic percentage of $HfO_2$ are 2. By comparison, the relative content rate of oxygen of $TaO_2$ is 0.8, while the relative content rate of oxygen of $HfO_2$ is 1.0. That is, the relative content rate of oxygen of $HfO_2$ is higher than that of $TaO_2$.

EMBODIMENTS

Hereinafter, embodiments of the present invention will be described with reference to the attached drawings.

In description of the embodiments of the present invention, "upper" is defined as a direction in which layers are stacked. In a case where the non-volatile memory device includes a substrate, "upper" indicates a direction which is more distant from the substrate, and "lower" indicates a direction which is closer to the substrate.

The embodiments described hereinafter are specific examples of the present invention. Numeric values, shapes, materials, constituents (elements), layout positions of the constituents, connection form of the constituents, steps, the order of the steps, etc., which are illustrated in the embodiments, are merely exemplary, and are not intended to limit the present invention. Also, among the constituents in the embodiments described below, the constituents which are not recited in independent claims defining a broadest concept of the present invention will be described as arbitrary constituents. Description of the constituents designated by the same reference numerals in the drawings will be sometimes omitted. For easier illustration, in the drawings, the constituents are schematically shown, and their shapes, dimension ratio, etc., are not sometimes accurate. Moreover, in a manufacturing method, the order of the steps, etc., can be changed and other known steps may be added as desired.

Embodiment 1

According to Embodiment 1, a non-volatile memory element comprises a first electrode; a second electrode; and a variable resistance layer which is interposed between the first electrode and the second electrode, and reversibly changes its resistance value in response to an electric signal applied between the first electrode and the second electrode; the variable resistance layer including, when a first metal is M and a second metal is N: a third metal oxide layer having a composition expressed as $NO_z$; a second metal oxide layer having a composition expressed as $NO_y$; and a first metal oxide layer having a composition expressed as $MO_x$ such that the third metal oxide layer, the second metal oxide layer and the first metal oxide layer are stacked in this order; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

In such a configuration, non-uniformity of characteristics of non-volatile memory elements can be lessened.

According to Embodiment 1, a non-volatile memory element comprises a first electrode; a second electrode; and a variable resistance layer which is interposed between the first electrode and the second electrode, and reversibly changes its resistance value in response to an electric signal applied between the first electrode and the second electrode; the variable resistance layer including a third metal oxide layer comprising a third metal oxide, a second metal oxide layer comprising a second metal oxide, and a first metal oxide layer comprising a first metal oxide such that the third metal oxide layer, the second metal oxide layer and the first metal oxide layer are stacked in this order; and wherein a resistivity of the second metal oxide is lower than a resistivity of the first metal oxide and is lower than a resistivity of the third metal oxide, and the resistivity of the third metal oxide is lower than the resistivity of the first metal oxide.

In such a configuration, non-uniformity of characteristics of non-volatile memory elements can be lessened.

In the non-volatile memory element, the composition of the third metal oxide layer and the composition of the second metal oxide layer may change stepwise between the third metal oxide layer and the second metal oxide layer.

In the non-volatile memory element, each of the third metal oxide layer and the second metal oxide layer may have a portion in which the composition is fixed in a thickness direction thereof.

In the non-volatile memory element, the first electrode may be disposed above the second electrode.

In the non-volatile memory element, the first electrode and the first metal oxide layer may be in contact with each other; the second electrode and the third metal oxide layer may be in contact with each other; the first electrode and the second electrode may comprise materials containing as major components elements which are different from each other; and wherein a standard electrode potential V1 of the first electrode, a standard electrode potential V2 of the second electrode, and a standard electrode potential Vt1 of the metal M may satisfy a relationship of Vt1<V1 and V2<V1.

In such a configuration, resistance change is enabled to take place only in a region of the variable resistance layer at the first electrode side, in the non-volatile memory element. Therefore, a resistance changing operation of the non-volatile memory element can be stabilized.

In the non-volatile memory element, the variable resistance layer may have a localized region which is lower in oxygen content atomic percentage than the first metal oxide layer, within the first metal oxide layer and the second metal oxide layer.

In the non-volatile memory element, the localized region may be placed in contact with the first electrode and not to be in contact with the third metal oxide layer; and wherein the localized region may be different in oxygen content atomic percentage from the second metal oxide layer.

In the non-volatile memory element, the resistance value may reversibly change from a first value to a second value which is greater than the first value by application of a first electric signal between the first electrode and the second electrode; and the resistance value may reversibly change from the second value to the first value by application of a second electric signal between the first electrode and the second electrode, the second electric signal being different in polarity from the first electric signal.

In the non-volatile memory element, the reversible change of the resistance value may take place by applying between the first electrode and the second electrode the electric signals which are different in polarity from each other.

In such a configuration, the non-volatile memory element is a bipolar non-volatile memory element.

In the non-volatile memory element, the variable resistance layer may comprise as a resistance changing material, an oxide of at least one metal selected from a group consisting of tantalum, hafnium, zirconium, titanium, niobium, tungsten, and aluminum.

In the non-volatile memory element, the metal M and the metal N may be an identical element.

In the non-volatile memory element, the metal M and the metal N may be tantalum, and the composition $TaO_x$ of the first metal oxide layer may satisfy $2.1 \leq x$.

In the non-volatile memory element, the metal M and the metal N may be hafnium. A composition $HfO_x$ of the first metal oxide layer may satisfy $1.8 < x$.

In the non-volatile memory element, the metal M and the metal N may be zirconium, and a composition $ZrO_x$ of the first metal oxide layer may satisfy $1.9 < x$.

According to Embodiment 1, a method of manufacturing a non-volatile memory element comprises, when a first metal is M and a second metal is N, the steps of: forming a second electrode; depositing a third metal oxide layer having a composition expressed as $NO_z$, on and above the second electrode; depositing a second metal oxide layer having a composition expressed as $NO_y$, on and above the third metal oxide layer; forming a first metal oxide layer having a composition expressed as $MO_x$ on and above the second metal oxide layer; and forming a first electrode on and above the first metal oxide layer; wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z are satisfied.

In the manufacturing method, at least the second metal oxide layer and the third metal oxide layer may be deposited by reactive sputtering in an oxygen atmosphere.

[Device Configuration]

FIG. 1 is a cross-sectional view showing an exemplary schematic configuration of a non-volatile memory element according to Embodiment 1. Hereinafter, with reference to FIG. 1, a non-volatile memory element 100 of Embodiment 1 will be described.

In an example of FIG. 1, the non-volatile memory element 100 includes a first electrode 106, a variable resistance layer 115 and a second electrode 104.

<First Electrode>

The first electrode 106 may comprise, for example, iridium (Ir). In this case, iridium is a first electrode material. A thickness of the first electrode may be set to, for example, 5 to 100 nm.

The first electrode 106 may comprise a material having a higher standard electrode potential than a metal constituting a first metal oxide layer 115x of the variable resistance layer 115 and a second electrode material constituting the second electrode 104, for example, at least one material, etc., selected from a group consisting of iridium, platinum (Pt), palladium (Pd), copper (Cu), and tungsten (W). This structure allows the redox reaction to selectively take place in a region within the first metal oxide layer 115x, which is in the vicinity of an interface between the first electrode 106 and the first metal oxide layer 115x. Thus, a stable resistance changing phenomenon can be implemented.

In the example of FIG. 1, the first electrode 106 is disposed above the second electrode 104.

<Variable Resistance Layer>

The variable resistance layer 115 is interposed between the first electrode 106 and the second electrode 104, and its resistance value reversibly changes in response to an electric signal applied between the first electrode 106 and the second electrode 104.

The variable resistance layer 115 includes, when a first metal is M and a second metal is N, a third metal oxide layer 115z having a composition expressed as $NO_z$, a second metal oxide layer 115y having a composition expressed as and a first metal oxide layer 115x having a composition expressed as $MO_x$ (M: first metal) such that the third metal oxide layer 115z, the second metal oxide layer 115y and the first metal oxide layer 115z are stacked in this order.

The third metal oxide layer 115z comprises a third metal oxide having a composition expressed as $NO_z$. The second metal oxide layer 115y comprises a second metal oxide having a composition expressed as $NO_y$. The first metal oxide layer 115x comprises a first metal oxide having a composition expressed as $MO_x$.

When an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, and an oxygen content atomic percentage of $NO_z$ is E, (D/B)<(C/A), (E/B)<(C/A) and y<z, i.e., D<E is satisfied.

That is, the ratio of the oxygen content atomic percentage of $NO_y$ with respect to the oxygen content atomic percentage of the oxide of the second metal N in the stoichiometric state is lower than the ratio of the oxygen content atomic percentage of $MO_x$ with respect to the oxygen content atomic percentage of the oxide of the first metal M in the stoichiometric state.

The ratio of the oxygen content atomic percentage of $NO_z$ with respect to the oxygen content atomic percentage of the oxide of the third metal N in the stoichiometric state is lower than the ratio of the oxygen content atomic percentage of $MO_x$ with respect to the oxygen content atomic percentage of the oxide of the first metal M in the stoichiometric state, and y<z is satisfied.

The resistivity of the second metal oxide is lower than the resistivity of the first metal oxide. The resistivity of the second metal oxide is lower than the resistivity of the third metal oxide. The resistivity of the third metal oxide is lower than the resistivity of the first metal oxide.

A thickness of the variable resistance layer 115 may be set to 20 to 100 nm.

In the example shown in FIG. 1, on and above the second electrode 104, the third metal oxide layer 115z having a composition expressed as $NO_z$, is formed in contact with the second electrode 104. In addition, on and above the third metal oxide layer 115z, the second metal oxide layer 115y having a composition expressed as $NO_y$ is formed in contact with the third metal oxide layer 115z. In addition, on and above the second metal oxide layer 115y, the first metal oxide layer 115x having a composition expressed as MO_x is formed in contact with the second metal oxide layer 115y. In addition, on and above the first metal oxide layer 115x, the first electrode 106 is formed in contact with the first metal oxide layer 115x.

The first metal oxide layer 115x is in contact with the first electrode 106. The third metal oxide layer 115z is in contact with the second electrode 104. The composition of the metal oxide layer may be defined as the relative content rate of oxygen or the resistivity of each layer. The resistivity of the metal oxide constituting the first metal oxide layer 115x may be set higher than the resistivity of the metal oxide constituting the second metal oxide layer 115y. The resistivity of the metal oxide constituting the third metal oxide layer 115z may be set higher than the resistivity of the metal oxide constituting the second metal oxide layer 115y and lower than the resistivity of the metal oxide constituting the first metal oxide layer 115x.

By applying a first electric signal between the first electrode and the second electrode, a resistance value of the variable resistance layer 115 (resistance value of non-volatile memory element 100) may reversibly change from a first value (low-resistance state) to a second value (high-resistance state) which is greater than the first value, while by applying a second electric signal which is different in polarity from the first electric signal between the first electrode and the second electrode, the resistance value may reversibly change from the second value (high-resistance state) to the first value (low-resistance state).

In other words, the reversible change of the resistance value may take place by applying between the first electrode and the second electrode the electric signals which are different in polarity from each other. That is, the non-volatile memory element 100 may be a bipolar non-volatile memory element.

The first metal M and the second metal N may be an identical element.

The variable resistance layer 115 may comprise as a variable resistance material an oxide of at least one metal selected from a group consisting of tantalum, hafnium, zirconium, and aluminum. In other words, each of the metal M and the metal N may be a metal selected from the group consisting of tantalum, hafnium, zirconium, and aluminum.

The metal M and the metal N may be tantalum, and the composition $TaO_x$ of the first metal oxide layer 115x may satisfy $2.1 \leq x$.

Now, the oxygen content atomic percentage in a case where the tantalum oxide is used as the material of the variable resistance layer will be studied. The applicant of the present application reported that in Patent literature 3 (International Publication No. 2008/059701), in a case where a tantalum oxide in an oxygen deficient state is used as a variable resistance layer which is a mono-layer, a stable operation occurs, in which a resistance value corresponding to a high-resistance state is equal to or more than five times as great as a resistance value corresponding to a low-resistance state, in a range in which x of $TaO_x$ is equal to or greater than 0.8 and is equal to or less than 1.9. The applicant of the present application also reported that in International Publication No. 2008/149484) recited above in the description of the related art, a forming operation becomes unnecessary and a stable pulse operation is enabled to take place by first voltage application, by inserting into an interface region of an electrode a tantalum oxide in which x of $TaO_x$ is equal to or greater than 2.1 to form a stacked-layer structure.

In light of the above, the composition of $TaO_x$ constituting the first metal oxide layer may have a range of $2.1 \leq x$, which makes it possible to omit the forming operation and selectively proceed the redox reaction.

The metal M and the metal N may be hafnium. A composition $HfO_x$ of the first metal oxide layer 115x may satisfy $1.8 < x$.

Now, the oxygen content atomic percentage in a case where the hafnium oxide is used as the material of the variable resistance layer will be studied. The applicant of the present application reported that in Patent literature 4 (International Publication No. 2010/004705), in a case where a hafnium oxide in an oxygen deficient state is used as a variable resistance layer which is a mono-layer, resistance change occurs, in a range in which x of $HfO_x$ is equal to or greater than 0.9 and is equal to or less than 1.6. The applicant of the present application also reported that, a forming operation becomes unnecessary and a stable pulse operation is enabled to take place by first voltage application, by inserting into an interface region of an electrode a hafnium oxide in which x of $HfO_x$ is greater than 1.8 to form a stacked-layer structure.

In light of the above, the composition of $HfO_x$ constituting the first metal oxide layer may have a range of $1.8 < x$, which makes it possible to omit the forming operation and selectively proceed the redox reaction.

In this case, a high-degree-oxygen-deficiency layer (second metal oxide layer 115y and third metal oxide layer 115z) comprising the hafnium oxide can be deposited by reactive sputtering in which sputtering is conducted using a Hf target in an atmosphere of argon gas and oxygen gas. The oxygen content atomic percentage of the high-degree-oxygen-deficiency layer can be adjusted easily by changing a flow ratio of oxygen gas with respect to argon gas during execution of the reactive sputtering, as in the case of the above stated tantalum oxide. It should be noted that the substrate may not be heated but may be set to a room temperature.

A low-degree-oxygen-deficiency layer (first metal oxide layer 115x) comprising the hafnium oxide can be produced by, for example, exposing an obverse surface of the high-degree-oxygen-deficiency layer in a plasma of a mixture gas of argon gas and oxygen gas. A thickness of the low-degree-oxygen-deficiency layer can be easily adjusted by varying a time for which the obverse surface of the high-degree-oxygen-deficiency layer is exposed in the plasma of the mixture gas of argon gas and oxygen gas. A thickness of the first metal oxide layer 115x may be set to equal to or greater than 3 nm and equal to or less than 4 nm.

The metal M and the metal N may be zirconium, and a composition $ZrO_x$ of the first metal oxide layer 115 may satisfy $1.9 < x$.

Now, the oxygen content atomic percentage in a case where a zirconium oxide is used as the material of the variable resistance layer will be studied. The applicant of the present application reported that in Patent literature 5 (Japanese Laid-Open Patent Application Publication No. 2010-21381), in a case where the zirconium oxide in an oxygen deficient state is used as a variable resistance layer which is a mono-layer, resistance change occurs, in a range in which x of $ZrO_x$ is equal to or greater than 0.9 and is equal to or less than 1.4. The applicant of the present application also reported that, a forming operation becomes unnecessary and a stable pulse operation is enabled to take place by first voltage application, by inserting into an interface region of an electrode a zirconium oxide in which x of $ZrO_x$ is greater than 1.9 to form a stacked-layer structure.

In light of the above, the composition of $ZrO_x$ contained in the first metal oxide layer may have a range of $1.9 < x$, which makes it possible to omit the forming operation and selectively proceed the redox reaction.

In this case, a high-degree-oxygen-deficiency layer (second metal oxide layer 115y and third metal oxide layer 115z) comprising the zirconium oxide can be deposited by reactive sputtering in which sputtering is conducted using a Zr target in an atmosphere of argon gas and oxygen gas. The oxygen content atomic percentage of the high-degree-oxygen-deficiency layer may be adjusted easily by changing a flow ratio of oxygen gas with respect to argon gas during execution of the reactive sputtering, as in the case of above stated tantalum oxide. It should be noted that the substrate may not be heated but may be set to a room temperature.

A low-degree-oxygen-deficiency layer (first metal oxide layer 115x) comprising the zirconium oxide can be produced, by, for example, exposing an obverse surface of the high-degree-oxygen-deficiency layer in a plasma of a mixture gas of argon gas and oxygen gas. A thickness of the low-degree-oxygen-deficiency layer can be easily adjusted by varying a time for which the obverse surface of the high-degree-oxygen-deficiency layer is exposed in the plasma of the mixture gas of argon gas and oxygen gas. A thickness of the first metal oxide layer 115x may be set to equal to or greater than 1 nm and equal to or less than 5 nm.

Alternatively, the above stated hafnium oxide layer and the above stated zirconium oxide layer may be deposited by CVD or ALD (atomic layer deposition), instead of the sputtering.

As the first metal M and the second metal N, for example, at least one transition metal selected from a group consisting of, for example, titanium (Ti), hafnium (Hf), zirconium (Zr), niobium (Nb), and tungsten (W), instead of tantalum (Ta). Since the transition metal can have plural oxidated states, different resistance states can be implemented by the redox reaction. As the first metal M and the second metal N, aluminum (Al) may be used.

The first metal M and the second metal N may be different elements. The resistance changing phenomenon in the variable resistance layer comprising the oxygen-deficient metal oxide occurs by migration of oxygen. Therefore, kinds of base metal may be different so long at least migration of oxygen is allowed to occur. Because of this, it is estimated that the same advantages are achieved even in a case where the first metal M constituting the first metal oxide layer 115x and the second metal N constituting the second metal oxide layer 115y and the third metal oxide layer 115z are different metals.

In a case where the first metal M and the second metal N are different metals, the standard electrode potential of the first metal M may be lower than that of the second metal N. This is because it is estimated that the resistance changing phenomenon occurs by an event that the redox reaction occurs in a localized region in the first metal oxide constituting the first metal oxide layer 115x corresponding to a high-resistance, and its resistance value changes.

For example, a stable resistance changing operation is attained by using the oxygen-deficient tantalum oxide as the second metal oxide layer 115y and the third metal oxide layer 115z and by using titanium oxide ($TiO_2$) as the first metal oxide layer 115x. Titanium (standard electrode potential=−1.63 eV) has a lower standard electrode potential than tantalum (standard electrode potential=−0.6 eV). The standard electrode potential is a characteristic in which as its value is greater, the corresponding material is less easily oxidated. By placing as the first metal oxide layer 115x an oxide of a metal having a lower standard electrode potential than the second metal oxide layer 115y and the third metal oxide layer 115z, the redox reaction easily occurs within the first metal oxide layer 115x. As another combination, for example, the oxygen-deficient tantalum oxide ($TaO_x$) may be used as the second metal oxide layer 115y and the third metal oxide layer 115z, and the aluminum oxide ($Al_2O_3$) may be used as the first metal oxide layer 115x.

The variable resistance layer 115 may be configured such that its side wall portion is oxidated.

It is sufficient that each of the high-degree-oxygen-deficiency layer and the low-degree-oxygen-deficiency layer comprises as a main variable resistance layer in which resistance change occurs, for example, an oxide of tantalum, hafnium, zirconium, etc., or an oxide of aluminum. In addition to this, each of the high-degree-oxygen-deficiency layer and the low-degree-oxygen-deficiency layer may comprise, for example, a minute amount of other element. For example, to finely adjust the resistance value, etc., each of the high-degree-oxygen-deficiency layer and the low-degree-oxygen-deficiency layer may be adapted to intentionally comprise a minute amount of other element. Such a case is included within the scope of the present invention. For example, if nitrogen is added to each of the variable resistance layers, the resistance value of the variable resistance layer is increased, which can improve a reactivity of resistance change.

In a case where the variable resistance layer is deposited by sputtering, ingress of a minimum amount of elements into the variable resistance layer sometimes occurs unintentionally, due to a residual gas or gas release from a wall of a vacuum container. As a matter of course, such a case where the variable resistance layer contains a minute amount of elements is included within the scope of the present invention.

The variable resistance layer 115 may not be constituted by three layers, but may be constituted by three or more layers.

The variable resistance layer 115 may have a localized region which is lower in oxygen content atomic percentage than the first metal oxide layer 115x, within the first metal oxide layer 115x and the second metal oxide layer 115y. The localized region may be placed in contact with the first electrode 106 and not to be in contact with the third metal oxide layer 115z, and may be different in oxygen content atomic percentage from the second metal oxide layer 115y. The localized region will be described in detail in Embodiment 3, and will not be described in the present embodiment.

<Second Electrode>

The second electrode 104 may comprise, for example, a tantalum nitride. In this case, the tantalum nitride is the second electrode material. A thickness of the second electrode 104 may be set to, for example, 5 to 100 nm.

In a case where tantalum is used as transition metal contained in the variable resistance layer 115, a material which has a standard electrode potential equal to or less than that of tantalum and does not cause resistance change easily, may be used as the second electrode 104. Specifically, as the second electrode 104, at least one material selected from a group consisting of tantalum, a tantalum nitride, titanium, a titanium nitride, and a titanium-aluminum nitride, may be used. In this configuration, a stable memory characteristic can be implemented.

Advantageous Effects of the Present Embodiment

With the above described configuration, the redox reaction of the first metal oxide is enabled to selectively take place in a region in the vicinity of the interface of the first electrode, and the polarity with which resistance change occurs is always stabilized. In addition, the third metal oxide layer which is higher in relative content rate of oxygen serves to suppress non-uniformity of resistances in a region which is distant from the interface of the first electrode. Since non-uniformity of read currents corresponding to the low-resistance state can be lessened, while decreasing a switching current for changing the element to the low-resistance state, a difference between the read current corresponding to the low-resistance state and a read current corresponding to the high-resistance state increases (it becomes easier to ensure a margin of reading of the current). As a result, misdetermination as to whether the element is in the low-resistance state or in the high-resistance state is less likely to occur, and hence a read error is less likely to occur.

Modified Example

The non-volatile memory 100 may include a substrate provided with a first wire, a first interlayer insulating layer comprising a silicon oxide layer (300 to 500 nm) formed on and above the substrate so as to cover the first wire, and a first contact plug (diameter: 50 to 300 nm Φ) formed so as to penetrate the first interlayer insulating layer such that the first contact plug is electrically connected to the first wire, and comprising tungsten as a major component.

Then, the second electrode 104 (in the present embodiment, lower electrode) may be formed on and above the first interlayer insulating layer so as to cover the first contact plug.

A second interlayer insulating layer comprising a silicon oxide layer (thickness: 300 to 500 nm) may be formed so as to cover the non-volatile memory element 100. A second contact plug (diameter: 50 to 300 nm Φ) comprising tungsten as a major component may be formed to penetrate the second interlayer insulating layer such that the second contact plug is electrically connected to the first electrode. The second wire may be formed on and above the second interlayer insulating layer so as to cover the second contact plug.

In the present embodiment, the first electrode 106 and the first metal oxide layer 115x are in contact with each other, while the second electrode 104 and the third metal oxide layer 115z are in contact with each other. In this case, the first electrode and the second electrode may comprise materials containing different elements as major components, and a standard electrode potential V1 of the first electrode, a standard electrode potential V2 of the second electrode, and a standard electrode potential Vt1 of the metal M constituting the first metal oxide layer may satisfy a relationship of Vt1<V1 and V2<V1.

In the present embodiment, for example, the first electrode 106 and the first metal oxide layer 115x are in contact with each other, the second electrode 104 and the third metal oxide layer 115z are in contact with each other, iridium (Ir) is used as the first electrode 106 and tantalum nitride (TaN) is used as the second electrode 104. The standard electrode potential V1 of iridium is 1.156V, while the standard electrode potential V2 of the tantalum nitride is 0.48V. In a case where the tantalum oxide is used as the variable resistance layer, Vt1<V1 and V2<V1 are satisfied because the standard electrode potential Vt of tantalum is −0.6V.

By satisfying the above relationship of the standard electrode potential (Vt1<V1 and V2<V1), it becomes easier to cause resistance change to take place only at a particular region which is a region of the interface between the first electrode 106 and the first metal oxide layer 115x, and it becomes possible to suppress an incorrect operation in a region of the interface between the second electrode 104 and the third metal oxide layer 115z.

The standard electrode potential Vt of hafnium is −1.55V. The standard electrode potential Vt of zirconium is −1.534V. The standard electrode potential Vt of aluminum is −1.676V. Therefore, in a case where iridium (Ir) is used as the first electrode 106 and the tantalum nitride (TaN) is used as the second electrode 104, the relationship of Vt1<V1 and the relationship of V2<V1 are satisfied, even when any of the hafnium oxide, the zirconium oxide and the aluminum oxide is used as the material of the variable resistance layer.

When a metal selected from a group consisting of hafnium, zirconium, and aluminum is used as the metal M of the first metal oxide layer, and tantalum is used as the metal N of the second metal oxide layer, Vt1<V1 and V2<V1 are satisfied.

The above implies that the redox reaction is allowed to surely take place and the resistance changing phenomenon is allowed to take place, between the first electrode 106 comprising iridium and the first metal oxide layer 115x which is higher in relative content rate of oxygen.

By satisfying the relationship of V1>V2, the redox reaction is allowed to preferentially take place in a region of the interface between the first electrode 106 comprising iridium and the first metal oxide layer 115x. Since the third metal oxide layer 115z is lower in relative content rate of oxygen than the first metal oxide layer 115x, the redox reaction does not take place between the second electrode 104 and the third metal oxide layer 115z. Therefore, an incorrect operation associated with the resistance changing phenomenon can be avoided.

Instead of iridium, the first electrode 106 may comprise any one of platinum (Pt; standard electrode potential=1.188V), palladium (Pd; standard electrode potential=0.951V), copper (Cu; standard electrode potential=0.521V) or a combination of these metals, and alloy of these metals.

Instead of tantalum nitride (TaN), the second electrode 104 may comprise any one metal of titanium nitride (TiN; standard electrode potential=0.55V), tungsten (W: standard electrode=−0.12V), and titanium (Ti; standard electrode potential=−1.63V).

From these candidates, the electrode which satisfy the relationship of Vt1<V1 and V2<V1, regarding the standard electrode potential, may be selected.

Although the variable resistance non-volatile memory element 100 according to Embodiment 1 as described above has a simple structure in which the variable resistance layer 115 has a planar shape, the structure of the non-volatile memory element 100 is not limited to this. For example, in the case of a non-volatile memory element having a hole structure suitable for miniaturization, the first metal oxide layer which is higher in relative content rate of oxygen may be in contact with the first electrode which allows the redox reaction to proceed, the third metal oxide layer which is lower in relative content rate of oxygen than the first metal oxide layer may be in contact with a region in the vicinity of the second electrode which allows non-uniformity of resistances of elements to be suppressed, and the second metal oxide layer which is lower in relative content rate of oxygen than the third metal oxide layer may be formed in a part of a region between the first metal oxide layer and the third metal oxide layer. The shape of the element may be any shape such as a mesa shape, a reversed mesa shape, etc.

The non-volatile memory elements may be combined with the constituents (substrate, wires, contact plugs, interlayer insulating layers) in the vicinity thereof to construct a non-volatile memory device. Each of the non-volatile memory elements may be an single constituent which does not include the constituents in the vicinity thereof.

The non-volatile memory element may be connected in series with a current steering (controlling) element such as a diode. In this configuration, a switching current is set equal to or smaller than a breakdown current of the current steering element. Especially in a case where the non-volatile memory element and the current steering element are formed to have a miniaturized structure, the breakdown current of the current steering element is smaller, and the switching current is set smaller correspondingly. The non-volatile memory element of the present embodiment is able to reduce a possibility of a read error even in such a case.

[Manufacturing Method]

FIGS. 2A to 2F are cross-sectional views showing the steps of an exemplary manufacturing method of the non-volatile memory element according to Embodiment 1.

Figure 2A:
FIG. 2A is a cross-sectional view showing the step of an exemplary manufacturing method of the non-volatile memory element according to Embodiment 1, and is a cross-sectional view showing the step of forming a second electrode.

FIG. 2A is a cross-sectional view showing the step of forming the second electrode.

As exemplarily shown in FIG. 2A, initially, on and above, for example, the substrate (not shown), the interlayer insulating layer (not shown), and the like, the second electrode 104 comprising the tantalum nitride is deposited, by reactive sputtering.

Figure 2B:
FIG. 2B is a cross-sectional view showing the step of the exemplary manufacturing method of the non-volatile memory element according to Embodiment 1, and is a cross-sectional view showing the step of forming a third metal oxide layer on and above the second electrode.

FIG. 2B is a cross-sectional view showing the step of forming the third metal oxide layer on and above the second electrode. The step of FIG. 2B is performed subsequently to and just after the step of FIG. 2A.

As exemplarily shown in FIG. 2B, on and above the second electrode 104, the third metal oxide layer 115$z$ comprising a metal oxide having a medium oxygen content atomic percentage is formed. Specifically, for example, the third metal oxide layer 115$z$ can be deposited by reactive sputtering in which sputtering is conducted using a tantalum target in an atmosphere of a mixture gas of argon and oxygen.

Figure 2C:
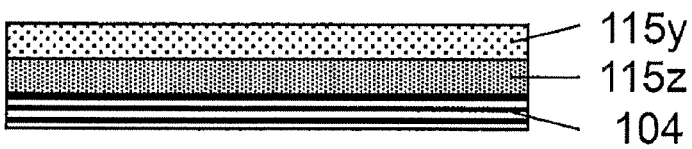
FIG. 2C is a cross-sectional view showing the step of the exemplary manufacturing method of the non-volatile memory element according to Embodiment 1, and is a cross-sectional view showing the step of forming a second metal oxide layer on and above the third metal oxide layer.

FIG. 2C is a cross-sectional view showing the step of forming the second metal oxide layer on and above the third metal oxide layer. The step of FIG. 2C is performed subsequently to and just after the step of FIG. 2B.

As exemplarily shown in FIG. 2C, on and above the third metal oxide layer 115$z$, the second metal oxide layer 115$y$ comprising a metal oxide which is lower in oxygen content atomic percentage than the third metal oxide layer 115$z$ is formed. Specifically, for example, as in the third metal oxide layer 115$z$, the second metal oxide layer 115$y$ can be deposited by reactive sputtering in which sputtering is conducted using a tantalum target in an atmosphere of a mixture gas of argon gas and oxygen gas.

Figure 2D:
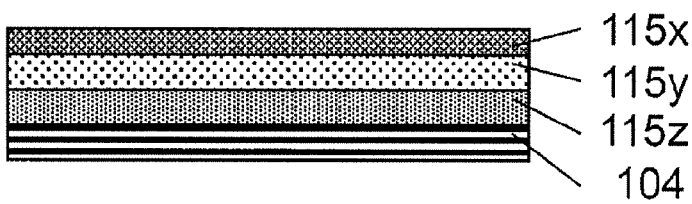
FIG. 2D is a cross-sectional view showing the step of the exemplary manufacturing method of the non-volatile memory element according to Embodiment 1, and is a cross-sectional view showing the step of forming a first metal oxide layer on and above the second metal oxide layer.

FIG. 2D is a cross-sectional view showing the step of forming the first metal oxide layer on and above the second metal oxide layer. The step of FIG. 2D is performed subsequently to and just after the step of FIG. 2C.

As exemplarily shown in FIG. 2D, on and above the second metal oxide layer 115$y$, the first metal oxide layer 115$x$ comprising the metal oxide having a highest relative content rate of oxygen is formed. Specifically, for example, as in the third metal oxide layer 115$z$, the first metal oxide layer 115$x$ can be deposited by reactive sputtering in which sputtering is conducted using a tantalum target in an atmosphere of a mixture gas of argon gas and oxygen gas.

For example, in a case where all of the third metal oxide layer 115$z$, the second metal oxide layer 115$y$, and the first metal oxide layer 115$x$ comprise these tantalum oxides, a magnitude relationship of oxygen content atomic percentage between the metal oxide layers can be controlled by setting a flow ratio of oxygen to argon such that the flow ratio of oxygen during deposition of the first metal oxide layer 115$x$>the flow ratio of oxygen during deposition of the third metal oxide layer 115$z$>the flow ratio of oxygen during deposition of the second metal oxide layer 115$y$.

Although the metal oxide layers are deposited using the reactive sputtering as described above, an obverse surface may be oxidated by plasma oxidation to form a metal oxide layer having a highest oxygen content atomic percentage. Typically, it is difficult to cause the metal oxide layer to contain oxygen more than that in the stoichiometric structure ($x=2.5$ in the case of tantalum oxide), by using the sputtering. However, in the case of using the plasma oxidation, oxygen is injected to grain boundaries, defects and the like of the tantalum oxide, which makes it possible to form the metal oxide layer which is higher in oxygen content atomic percentage than the stoichiometric structure. Such a structure can effectively lessen a leak current.

The reactive sputtering may be performed by sputtering using a tantalum oxide target in an atmosphere of a mixture gas of argon gas and oxygen gas.

Figure 2E:
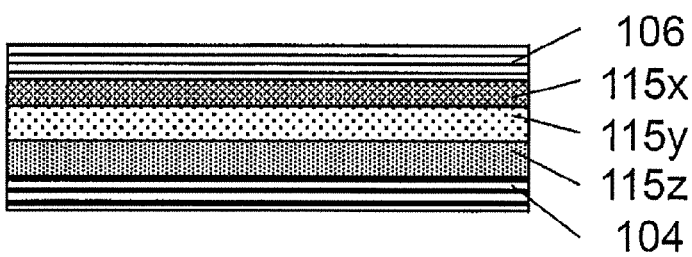
FIG. 2E is a cross-sectional view showing the step of the exemplary manufacturing method of the non-volatile memory element according to Embodiment 1, and is a cross-sectional view showing the step of forming a first electrode on and above the first metal oxide layer.

FIG. 2E is a cross-sectional view showing the step of forming the first electrode on and above the first metal oxide layer. The step of FIG. 2E is performed subsequently to and just after the step of FIG. 2D.

As exemplarily shown in FIG. 2E, on and above the first metal oxide layer 115$x$, the first electrode 106 comprising iridium is deposited by sputtering.

Figure 2F:
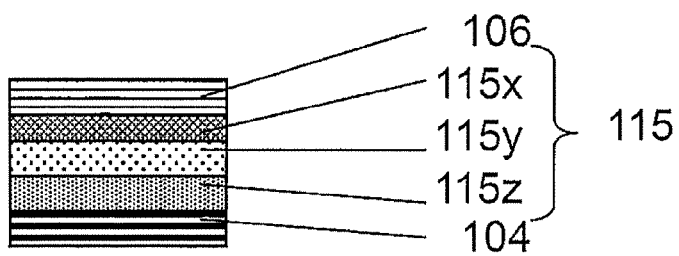
FIG. 2F is a cross-sectional view showing the step of the exemplary manufacturing method of the non-volatile memory element according to Embodiment 1, and is a cross-sectional view showing the step of completing the non-volatile memory element by etching.

FIG. 2F is a cross-sectional view showing the step of completing the non-volatile memory element by etching. The step of FIG. 2F is performed subsequently to and just after the step of FIG. 2E.

As exemplarily shown in FIG. 2F, the second electrode 104, the third metal oxide layer 115$z$, the second metal oxide layer 115$y$, the first metal oxide layer 115$x$, and the first electrode 106 are patterned using a desired mask, thereby completing the non-volatile memory element 100.

It is difficult to etch a precious metal, etc., and the precious metal is a representative material having a high standard electrode potential. In a case where the precious metal is used as the material of the first electrode 106, the non-volatile memory element 100 may be formed using the first electrode 106 as a hard mask. Although in the present step, the second electrode 104, the third metal oxide layer 115$z$, the second metal oxide layer 115$y$, the first metal oxide layer 115$x$, and the first electrode 106 are patterned together using the same mask, the patterning may be performed individually in each step.

By the manufacturing method as described above, it is possible to form the metal oxides which are different in relative content rate of oxygen from each other depending on the oxygen flow, that is, individually form the first metal oxide layer, the second metal oxide layer and the third metal oxide layer such that they are different in relative content rate of oxygen from each other. With this configuration, the redox reaction of the first metal oxide is enabled to selectively take place in a region in the vicinity of the interface between the first electrode and the first metal oxide layer, and the polarity with which resistance change occurs is always stabilized. In addition, the third metal oxide layer which is higher in relative content rate of oxygen serves to suppress non-uniformity of resistances in a region which is distant from the interface of the first electrode. Since non-uniformity of read currents corresponding to the low-resistance state can be lessened, while decreasing a switching current for changing the element to the low-resistance state, a difference between the read current corresponding to the low-resistance state and a read current corresponding to the high-resistance state increases (it becomes easier to ensure a margin of reading of the current). As a result, misdetermination as to whether the element is in the low-resistance state or in the high-resistance state is less likely to occur, and hence a read error is less likely to occur.

[Stepwise Composition Change]

In the present embodiment, the composition of the third metal oxide layer and the composition of the second metal oxide layer may change stepwise between the third metal oxide layer and the second metal oxide layer. Each of the third metal oxide layer and the second metal oxide layer may have a portion in which the composition is fixed in a thickness direction thereof.

Figure 10A:
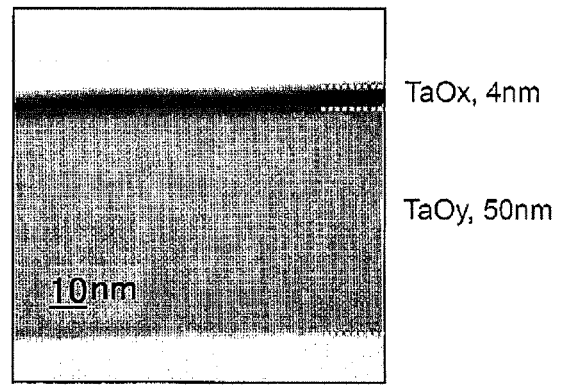
FIG. 10A is a transmission electron microscope (TEM) photograph of a sample according to a reference example 1.
Figure 10B:
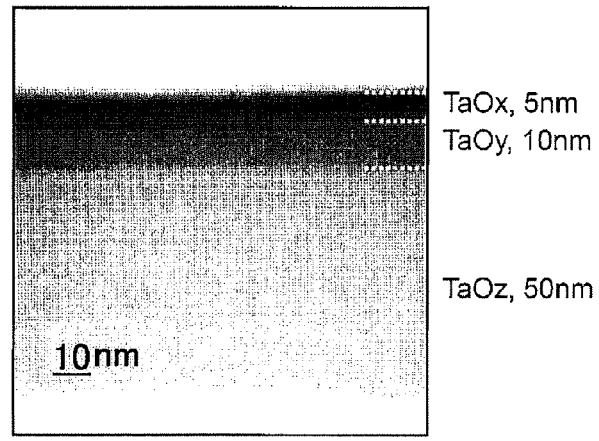
FIG. 10B is a transmission electron microscope (TEM) photograph of a sample according to a reference example 2.

FIG. 10A is a transmission electron microscope (TEM) photograph of a sample according to a reference example 1. FIG. 10B is a transmission electron microscope (TEM) photograph of a sample according to a reference example 2. As the transmission electron microscope (TEM), HF-2200 manufactured by HITACHI HIGH TECHNOLOGIES Co., Ltd. was used. The sample of FIG. 10A is a layer including an upper layer comprising $TaO_x$ (x=2.4) and having a thickness of about 4 nm, and a lower layer comprising $TaO_y$ (y=1.11) and having a thickness of about 50 nm. The sample of FIG. 10B is a layer including an upper layer comprising $TaO_x$ (x=2.4) and having a thickness of about 5 nm, an intermediate layer comprising $TaO_y$ (y=1.29) and having a thickness of about 10 nm, and a lower layer comprising $TaO_z$ (z=0.96) and having a thickness of about 50 nm. In these samples, each layer is deposited by sputtering independently.

Figure 11A:
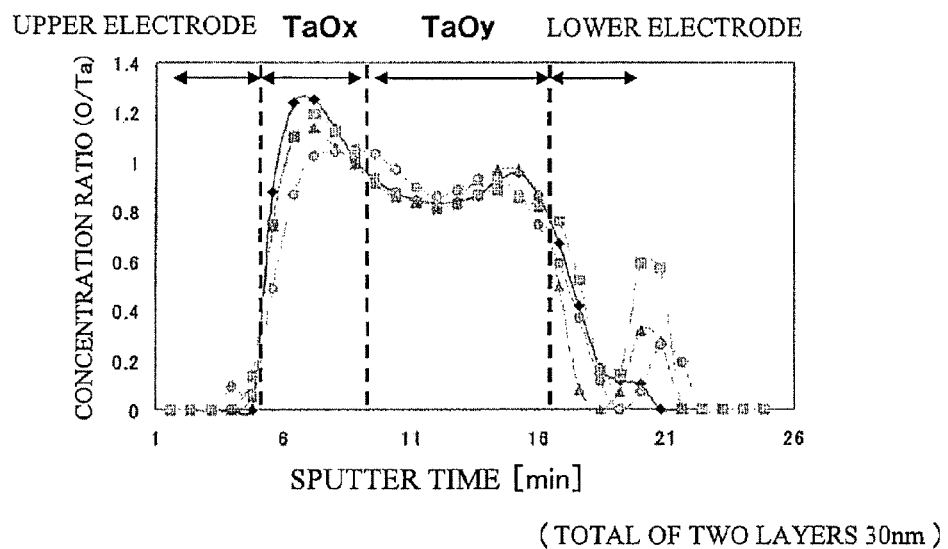
FIG. 11A is a graph showing a composition profile (AES) of a sample according to a reference example 3.
Figure 11B:
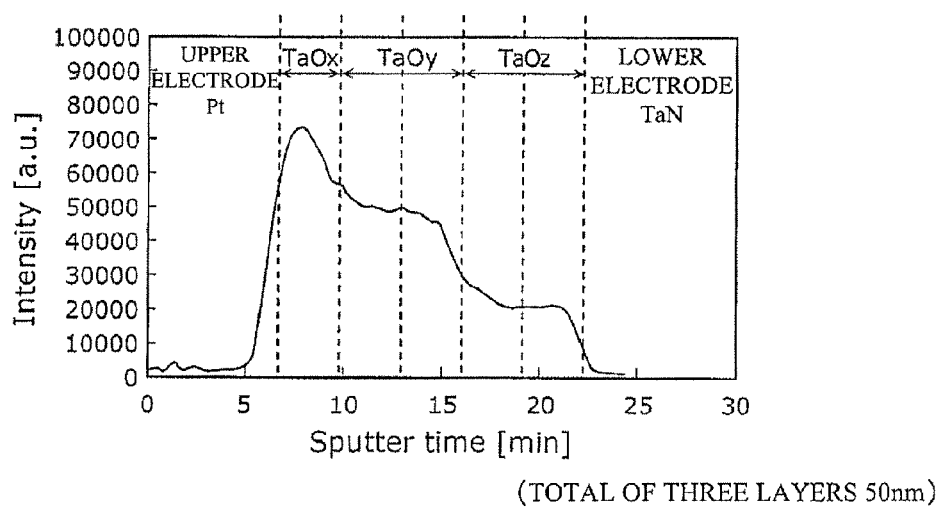
FIG. 11B is a graph showing a composition profile (AES) of a sample according to a reference example 4.

FIG. 11A is a graph showing a composition profile (AES) of a sample according to a reference example 3. FIG. 11B is a graph showing a composition profile (AES) of a sample according to a reference example 4. As a measurement device of the AES, PHI-700 manufactured by ULVAC-PHI, INC. was used. As a measuring method, sputter etching was used. The sample of FIG. 11A is a layer including an upper layer comprising $TaO_x$ (x=2.4) and a lower layer comprising $TaO_y$ (y=1.29). The sample of FIG. 11B is a layer including an upper layer comprising $TaO_x$ (x=2.4), an intermediate layer comprising $TaO_y$ (y=1.6), and a lower layer comprising $TaO_z$ (z=0.96). In these samples, each layer is deposited by sputtering independently.

FIG. 10A corresponds to FIG. 11A, and shows the sample including two metal oxide layers. The lower layer ($TaO_x$) is thicker than the upper layer ($TaO_y$), and there is a composition change in the lower layer ($TaO_y$) but there is no stepwise change between the upper and lower layers. Specifically, as can be seen from FIG. 11A, there exist a portion having a higher concentration ratio (O/Ta) and a portion having a lower concentration ratio (O/Ta), in the lower layer ($TaO_y$), but each of these portions does not have a portion (portion in which a concentration ratio line is horizontal in the graph of FIG. 11A) in which its composition is fixed in the thickness direction thereof.

It is estimated that the change in the composition of the lower layer ($TaO_y$) as shown in FIG. 11A, is primarily attributed to the fact that oxygen is diffused in thermal treatment in a post process after formation of the variable resistance element, and oxygen stays in a region in the vicinity of the interface between the lower layer and the lower electrode (see International Publication No. 2012/046454, FIG. 14, paragraph 0043, and others).

FIG. 10B corresponds to FIG. 11B, and shows the sample including three metal oxide layers. FIG. 10B shows the sample in which its composition changes stepwisely between the intermediate layer ($TaO_y$) and the lower layer ($TaO_z$). As can be seen from FIG. 11B, the concentration ratio (O/Ta) is constant in the thickness direction thereof in the intermediate layer ($TaO_y$) and the lower layer ($TaO_z$), and each of these layers has a portion (portion in which a concentration ratio line is horizontal in the graph of FIG. 11B) in which its composition is fixed in the thickness direction thereof (see International Publication No. 2012/046454, FIG. 3(c), paragraph 0074, and others).

The change in the composition in the intermediate layer ($TaO_y$) and the lower layer ($TaO_z$) as shown in FIG. 11B, is attributed to the fact that the intermediate layer and the lower layer are deposited independently by sputtering, etc., in the process for forming the variable resistance layer.

In the present specification, the term "stepwise change" is defined as a change by which the corresponding layers are clearly observed as different layers in the transmission electron microscope (TEM) photograph, like the intermediate layer ($TaO_y$) and the lower layer ($TaO_z$) as shown in FIG. 10B, or a stepwise change in a composition profile, like the intermediate layer ($TaO_y$) and the lower layer ($TaO_z$) as shown in FIG. 11B.

On the other hand, in the present specification, the term "stepwise change" is meant not to include a case where the corresponding layers are not clearly observed as different layers in the transmission electron microscope (TEM) photograph, like the portions which are different in composition from each other, within the lower layer ($TaO_y$) of FIG. 10A, or a case where the composition profile changes gently like the portion in which the concentration ratio (O/Ta) is higher and the portion in which the concentration ratio (O/Ta) is lower, within the lower layer ($TaO_y$) of FIG. 11A.

Also, in the present specification, the phrase "has a portion in which its composition is fixed in the thickness direction thereof" means that the corresponding layers are clearly observed as different layers in the transmission electron microscope (TEM) photograph, like the intermediate layer ($TaO_y$) and the lower layer ($TaO_z$) as shown in FIG. 10B, or the composition profile changes stepwisely, like the intermediate layer ($TaO_y$) and the lower layer ($TaO_z$) as shown in FIG. 11B.

On the other hand, in the present specification, the phrase "has a portion in which its composition is fixed in the thickness direction thereof" is meant not to include a case where the corresponding layers are not clearly observed as different layers in the transmission electron microscope (TEM) photograph, like the portions which are different from each other in composition within the lower layer ($TaO_y$) of FIG. 10A, or a case where the composition profile changes gently like the portion in which the concentration ratio (O/Ta) is higher and the portion in which the concentration ratio (O/Ta) is lower, within the lower layer ($TaO_y$) of FIG. 11A. The above also applies to Embodiment 2.

Embodiment 2

A non-volatile memory element of Embodiment 2 is the nonvolatile memory element according to any of Embodiment 1 and modified examples of Embodiment 1, and is configured such that a second electrode is disposed above a first electrode.

A manufacturing method of the non-volatile memory element of Embodiment 2 comprises the steps of forming the first electrode, forming a first metal oxide layer having a composition expressed as $MO_x$ (M: first metal) on and above the first electrode, depositing a second metal oxide layer having a composition expressed as $NO_y$ (N: second metal) on and above the first metal oxide layer, depositing a third metal oxide layer having a composition expressed as $NO_z$ on and above the third metal oxide layer, and forming the second electrode on and above the third metal oxide layer, wherein when an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D and an oxygen content atomic percentage of $NO_z$ is E, (D/B)<(C/A), (E/B)<(C/A) and y<z are satisfied.

In the above manufacturing method, at least the first metal oxide layer, the second metal oxide layer and the third metal oxide layer may be deposited by reactive sputtering in an oxygen atmosphere.

[Device Configuration]

Figure 3:
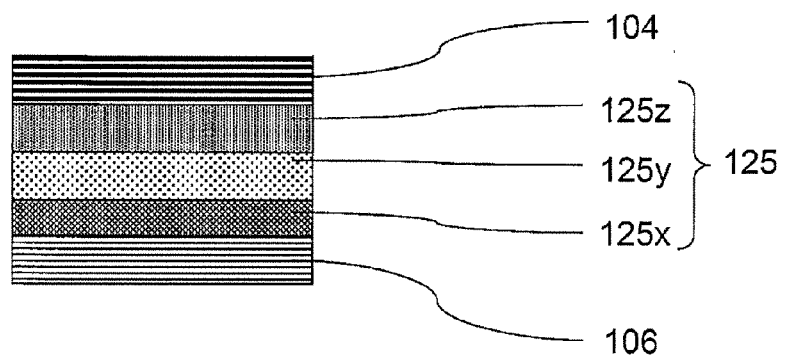
FIG. 3 is a cross-sectional view showing an exemplary schematic configuration of a non-volatile memory element according to Embodiment 2.

FIG. 3 is a cross-sectional view showing an exemplary schematic configuration of a non-volatile memory element according to Embodiment 2. Hereinafter, the non-volatile memory element 200 of Embodiment 2 will be described with reference to FIG. 3.

In the example of FIG. 3, the non-volatile memory element 200 includes the first electrode 106, a variable resistance layer 125 and the second electrode 104.

The first electrode 106 and the second electrode 104 may have the same configuration as that of Embodiment 1 except for its reversed vertical positional relationship, and will not be described in detail.

In the example of FIG. 3, the variable resistance layer 125 has a structure as follows. A first metal oxide layer 125x having a composition expressed as $MO_x$ is formed on and above the first electrode 106 in contact with the first electrode 106. A second metal oxide layer 125y having a composition expressed as $NO_y$ is formed on and above the first metal oxide layer 125x in contact with the first metal oxide layer 125x. A third metal oxide layer 125z having a composition expressed as $NO_z$ is formed on and above the second metal oxide layer 125y in contact with the second metal oxide layer 125y. The second electrode 104 is formed on and above the third metal oxide layer 125z in contact with the third metal oxide layer 125z.

Except for the above, the variable resistance layer 125, the first metal oxide layer 125x, the second metal oxide layer 125y and the third metal oxide layer 125z may be configured to be the same as the variable resistance layer 115, the first metal oxide layer 115x, the second metal oxide layer 115y and the third metal oxide layer 115z of Embodiment 1, respectively, and will not be described in detail in repetition.

[Manufacturing Method]

FIGS. 4A to 4F are cross-sectional views showing the steps of an exemplary manufacturing method of the non-volatile memory element according to Embodiment 2.

Figure 4A:
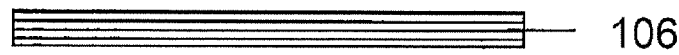
FIG. 4A is a cross-sectional view showing the step of an exemplary manufacturing method of the non-volatile memory element according to Embodiment 2, and is a cross-sectional view showing the step of forming a first electrode.

FIG. 4A is a cross-sectional view showing the step of forming the first electrode.

As exemplarily shown in FIG. 4A, initially, on and above, for example, the substrate (not shown), the interlayer insulating layer (not shown), and the like, the first electrode 106 comprising iridium is formed. At this time, to prevent migration in the first electrode 106 due to a thermal stress in a post-process step, the first electrode 106 can be sintered in advance at a high temperature (400 degrees C.). This provides advantages that an interface between the first electrode 106 and the first metal oxide layer 125x can be stabilized and hence a stable device operation can be implemented.

Figure 4B:
FIG. 4B is a cross-sectional view showing the step of the exemplary manufacturing method of the non-volatile memory element according to Embodiment 2, and is a cross-sectional view showing the step of forming a first metal oxide layer on and above the first electrode.

FIG. 4B is a cross-sectional view showing the step of forming the first metal oxide layer on and above the first electrode. The step of FIG. 4B is performed subsequently to and just after the step of FIG. 4A.

As exemplarily shown in FIG. 4B, on and above the first electrode 106, the first metal oxide layer 125x comprising a metal oxide having a highest relative content rate of oxygen is formed. Specifically, for example, the first metal oxide layer 125x can be deposited by reactive sputtering in which sputtering is conducted using a tantalum target in an oxygen gas atmosphere.

Although the first metal oxide layer 125x is deposited using the reactive sputtering in this case, a plasma oxidation step may be added. Typically, it is difficult to cause the metal oxide layer to contain oxygen more than that in the stoichiometric structure (x=2.5 in the case of tantalum oxide), by using the sputtering. However, in the case of using the plasma oxidation, oxygen is injected into grain boundaries, defects and the like of the tantalum oxide, which makes it possible to form the metal oxide layer which is higher in oxygen content atomic percentage than the stoichiometric structure. Such a structure can effectively lessen a leak current.

Figure 4C:
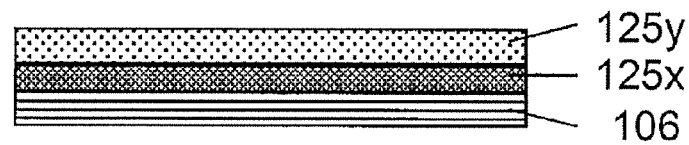
FIG. 4C is a cross-sectional view showing the step of the exemplary manufacturing method of the non-volatile memory element according to Embodiment 2, and is a cross-sectional view showing the step of forming a second metal oxide layer on and above the first metal oxide layer.

FIG. 4C is a cross-sectional view showing the step of forming the second metal oxide layer on and above the first metal oxide layer. The step of FIG. 4C is performed subsequently to and just after the step of FIG. 4B.

As exemplarily shown in FIG. 4C, on and above the first metal oxide layer 125x, the second metal oxide layer 125y comprising a metal oxide which is lowest in relative content rate of oxygen is formed. Specifically, for example, as in the first metal oxide layer 125x, the second metal oxide layer 115y can be deposited by reactive sputtering in which sputtering is conducted using a tantalum target in an oxygen gas atmosphere.

Figure 4D:
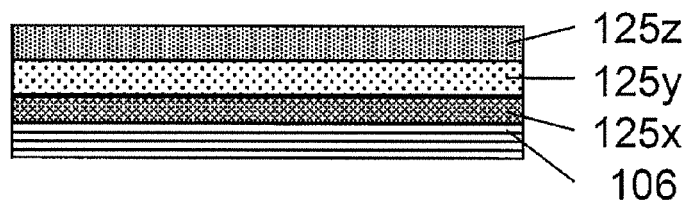
FIG. 4D is a cross-sectional view showing the step of the exemplary manufacturing method of the non-volatile memory element according to Embodiment 2, and is a cross-sectional view showing the step of forming a third metal oxide layer on and above the second metal oxide layer.

FIG. 4D is a cross-sectional view showing the step of forming the third metal oxide layer on and above the second metal oxide layer. The step of FIG. 4D is performed subsequently to and just after the step of FIG. 4C.

As exemplarily shown in FIG. 4D, on and above the second metal oxide layer 125y, the third metal oxide layer 115z is formed. Specifically, for example, the third metal oxide layer 125z can be deposited by reactive sputtering in which sputtering is conducted using a tantalum target in an atmosphere of argon and oxygen gas.

Although each of the metal oxide layers is deposited using the tantalum target, it may be performed using a tantalum oxide target having an oxygen content atomic percentage adjusted in advance.

Figure 4E:
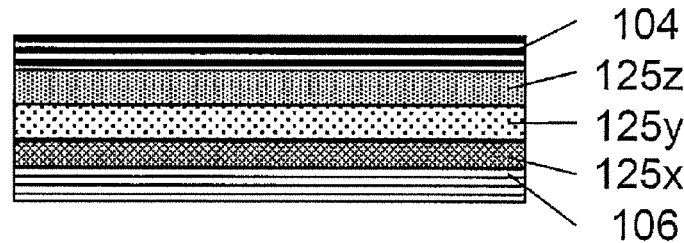
FIG. 4E is a cross-sectional view showing the step of the exemplary manufacturing method of the non-volatile memory element according to Embodiment 2, and is a cross-sectional view showing the step of forming a second electrode on and above the third metal oxide layer.

FIG. 4E is a cross-sectional view showing the step of forming the second electrode on and above the third metal oxide layer. The step of FIG. 4E is performed subsequently to and just after the step of FIG. 4D.

As exemplarily shown in FIG. 4E, on and above the third metal oxide layer 125z, the second electrode 104 comprising tantalum nitride is formed.

Figure 4F:
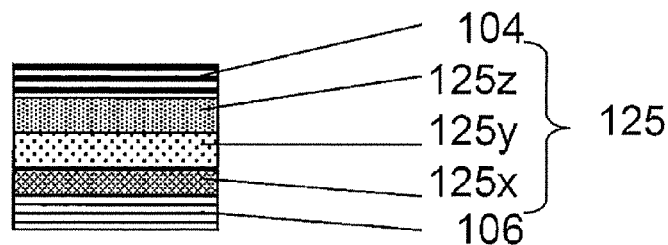
FIG. 4F is a cross-sectional view showing the step of the exemplary manufacturing method of the non-volatile memory element according to Embodiment 2, and is a cross-sectional view showing the step of completing the non-volatile memory element by etching.

FIG. 4F is a cross-sectional view showing the step of completing the non-volatile memory element by etching. The step of FIG. 4F is performed subsequently to and just after the step of FIG. 4E.

As exemplarily shown in FIG. 4F, the first electrode 106, the first metal oxide layer 125x, the second metal oxide layer 125y, the third metal oxide layer 125z and the second electrode 104 are patterned using a desired mask, thereby completing the non-volatile memory element 200.

Although in the present step, the first electrode 106, the first metal oxide layer 125x, the second metal oxide layer 125y, the third metal oxide layer 125z and the second electrode 104 are patterned together using the same mask, the patterning may be performed individually in each step.

By the manufacturing method as described above, it is possible to form the metal oxides which are different in relative content rate of oxygen from each other depending on the oxygen flow, that is, individually form the first metal oxide layer, the second metal oxide layer and the third metal oxide layer such that they are different in relative content rate of oxygen from each other. With this configuration, the redox reaction of the first metal oxide is enabled to selectively take place in a region in the vicinity of the interface between the first electrode and the first metal oxide layer, and the polarity with which resistance change occurs is always stabilized. In addition, the third metal oxide layer which is higher in relative content rate of oxygen serves to suppress non-uniformity of resistances in a region which is distant from the interface of the first electrode. Since non-uniformity of read currents corresponding to the low-resistance state can be lessened, while decreasing a switching current for changing the element to the low-resistance state, a difference between the read current corresponding to the low-resistance state and a read current corresponding to the high-resistance state increases (it becomes easier to ensure a margin of reading of the current). As a result, misdetermination as to whether the element is in the low-resistance state or in the high-resistance state is less likely to occur, and hence a read error is less likely to occur.

Modified examples of Embodiment 1 may also be applied to Embodiment 2.

Embodiment 3

A non-volatile memory element of Embodiment 3 is the non-volatile memory element of any of Embodiment 1, Embodiment 2, and modified examples of Embodiment 1 and Embodiment 2, and is configured such that a variable resistance layer includes a fourth oxide layer having a composition expressed as $NO_a$, the third metal oxide layer, the second metal oxide layer and the first metal oxide layer such that these layers are stacked in this order, and (F/B)<(C/A) and a<z are satisfied, when an oxygen content atomic percentage of $NO_a$ is F.

The non-volatile memory element of Embodiment 3 is the non-volatile memory element of any of Embodiment 1, Embodiment 2, and modified examples of Embodiment 1 and Embodiment 2, and is configured such that a variable resistance layer includes the fourth metal oxide layer comprising a fourth metal oxide, the third metal oxide layer, the second metal oxide layer and the first metal oxide layer such that these layers are stacked in this order, the fourth metal oxide having a lower resistivity than the third metal oxide.

In the non-volatile memory element, the first electrode and the first metal oxide layer may be in contact with each other, the second electrode and the fourth metal oxide layer may be in contact with each other, the first electrode and the second electrode may comprise materials containing as major components elements which are different from each other, and the standard electrode potential V1 of the material constituting the first electrode, the standard electrode potential V2 of the material constituting the second electrode, and the standard electrode potential Vt1 of the metal M may satisfy a relationship of Vt1<V1 and V2<V1.

In the non-volatile memory element, the variable resistance layer may be configured such that each of the first metal oxide layer and the second metal oxide layer has a localized region which is lower in oxygen content atomic percentage than the first metal oxide layer.

In the non-volatile memory element, the localized region may be placed in contact with the first electrode and not to be in contact with the third metal oxide layer, and may be different in oxygen content atomic percentage from the second metal oxide layer.

A manufacturing method of the non-volatile memory element of Embodiment 3 is the manufacturing method of the non-volatile memory element of any of Embodiment 1 and modified examples of Embodiment 1, and further comprises the step of forming the fourth metal oxide layer having a composition expressed as $NO_a$ on and above the second electrode before the step of forming the third metal oxide, and the step of forming the third metal oxide layer is the step of forming the third metal oxide layer having a composition expressed as $NO_z$ on and above the fourth metal oxide layer, and (F/B)<(C/A) and a<z are satisfied, when the oxygen content atomic percentage of $NO_a$ is F.

In the above manufacturing method, at least the second metal oxide layer, the third metal oxide layer, and the fourth metal oxide layer may be deposited by reactive sputtering in an oxygen atmosphere.

A manufacturing method of the non-volatile memory element of Embodiment 3 is the manufacturing method of the non-volatile memory element of any of Embodiment 2 and modified examples of Embodiment 2, and further comprises the step of forming the fourth metal oxide layer having a composition expressed as $NO_a$ on and above the third metal oxide before the step of forming the second electrode, and the step of forming the second electrode is the step of forming the second electrode on and above the fourth metal oxide layer, and (F/B)<(C/A) and a<z are satisfied, when the oxygen content atomic percentage of $NO_a$ is F.

In the above manufacturing method, at least the first metal oxide layer, the second metal oxide layer, the third metal oxide layer, and the fourth metal oxide layer may be deposited by reactive sputtering in an oxygen atmosphere.

[Device Configuration]

Figure 5:
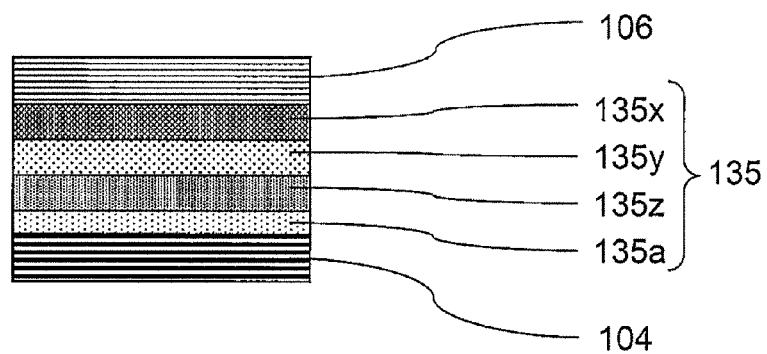
FIG. 5 is a cross-sectional view showing an exemplary schematic configuration of a non-volatile memory element according to Embodiment 3.

FIG. 5 is a cross-sectional view showing an exemplary schematic configuration of the non-volatile memory element according to Embodiment 1. Hereinafter, a non-volatile memory element 300 of Embodiment 1 will be described with reference to FIG. 5.

In the example of FIG. 5, the non-volatile memory element 300 includes the first electrode 106, a variable resistance layer 135 and the second electrode 104.

The first electrode 106 and the second electrode 104 may have the same configuration as that of Embodiment 1, and will not be described in detail in repetition.

The variable resistance layer 135 is interposed between the first electrode 106 and the second electrode 104 and reversibly changes its resistance value in response to the electric signal applied between the first electrode and the second electrode.

The variable resistance layer 135 includes, when a first metal is M and a second metal is N, a fourth metal oxide layer 135a having a composition expressed as $NO_a$, a third metal oxide layer 135z having a composition expressed as $NO_z$, a second metal oxide layer 135y having a composition expressed as $NO_y$ and a first metal oxide layer 135x having a composition expressed as $MO_x$ such that these layers are stacked in this order.

The fourth metal oxide layer 135a comprises a fourth metal oxide having a composition expressed as $NO_a$. The third metal oxide layer 135z comprises a third metal oxide having a composition expressed as $NO_z$. The second metal oxide layer 135y comprises a second metal oxide having a composition expressed as $NO_y$. The first metal oxide layer 135x comprises a first metal oxide having a composition expressed as $MO_x$.

When an oxygen content atomic percentage of an oxide of the first metal M in a stoichiometric state is A, an oxygen content atomic percentage of an oxide of the second metal N in a stoichiometric state is B, an oxygen content atomic percentage of $MO_x$ is C, an oxygen content atomic percentage of $NO_y$ is D, an oxygen content atomic percentage of $NO_z$ is E, and an oxygen content atomic percentage of $NO_a$ is F, (D/B)<(C/A), (E/B)<(C/A), (F/B)<(C/A), y<z, i.e., D<E, and a<z, i.e., F≤E are satisfied.

That is, the ratio of the oxygen content atomic percentage of $NO_y$ with respect to the oxygen content atomic percentage of the oxide of the second metal N in the stoichiometric state is lower than the ratio of the oxygen content atomic percentage of $MO_x$ with respect to the oxygen content atomic percentage of the oxide of the first metal M in the stoichiometric state.

The ratio of the oxygen content atomic percentage of $NO_z$ with respect to the oxygen content atomic percentage of the oxide of the second metal N in the stoichiometric state is lower than the ratio of the oxygen content atomic percentage of $MO_x$ with respect to the oxygen content atomic percentage of the oxide of the first metal M in the stoichiometric state, and y<z is satisfied.

The ratio of the oxygen content atomic percentage of $NO_a$ with respect to the oxygen content atomic percentage of the oxide of the second metal N in the stoichiometric state is lower than the ratio of the oxygen content atomic percentage of $MO_x$ with respect to the oxygen content atomic percentage of the oxide of the first metal M in the stoichiometric state, and a<z is satisfied.

The resistivity of the second metal oxide is lower than the resistivity of the first metal oxide. The resistivity of the second metal oxide is lower than the resistivity of the third metal oxide. The resistivity of the third metal oxide is lower than the resistivity of the first metal oxide. The resistivity of the fourth metal oxide is lower than the resistivity of the third metal oxide.

A thickness of the variable resistance layer 115 may be set to 20 to 100 nm.

Moreover, a<y, i.e., F<D may be satisfied. The resistivity of the fourth metal oxide may be lower than the resistivity of the second metal oxide. In this configuration, the fourth metal oxide in contact with the second electrode has a lowest oxygen content atomic percentage, among the first to fourth metal oxides. Because of this, resistance change does not easily take place in a region of the interface between the second electrode and the fourth metal oxide. Thus, the resistance change is enabled to take place stably only in a region of the interface between the first electrode and the first metal oxide.

In the example of FIG. 5, the variable resistance layer 135 has a structure as follows. The fourth metal oxide layer 135a having a composition expressed as $NO_a$ is formed on and above the second electrode 104 such that the fourth metal oxide layer 135a is in contact with the second electrode 104. The third metal oxide layer 135z having a composition expressed as $NO_z$ is formed on and above the fourth metal oxide layer 135a such that the third metal oxide layer 135z is in contact with the fourth metal oxide layer 135a. The second metal oxide layer 135y having a composition expressed as $NO_y$ is formed on and above the third metal oxide layer 135z such that the second metal oxide layer 135y is in contact with the third metal oxide layer 135z. The first metal oxide layer 135x having a composition expressed as $MO_x$ is formed on and above the second metal oxide layer 135y such that the first metal oxide layer 135x is in contact with the second metal oxide layer 135y. The first electrode 106 is formed on and above the first metal oxide layer 135x such that the first electrode 106 is in contact with the first metal oxide layer 135x.

The first metal oxide layer 135x is in contact with the first electrode 106. The fourth metal oxide layer 135a is in contact with the second electrode 104. The first metal M and the second metal N constituting these metal oxide layers, respectively, may comprise the same element or elements different from each other. The composition of each metal oxide layer may be defined by its relative content rate of oxygen, or by the resistivity of each layer. The resistivity of the metal oxide constituting the first metal oxide layer 135x may be set higher than the resistivity of the metal oxide constituting the second metal oxide layer 135y. The resistivity of the metal oxide constituting the third metal oxide layer 135z may be set higher than the resistivity of the metal oxide constituting the second metal oxide layer 135y and lower than the resistivity of the metal oxide constituting the first metal oxide layer 135x. The resistivity of the metal oxide constituting the fourth metal oxide layer 135a may be set lower than the resistivity of the metal oxide constituting the third metal oxide layer 135z.

The variable resistance layer 135 may have a resistance changing characteristic which is similar to that of the variable resistance layer 115 of Embodiment 1. In other words, for example, the non-volatile memory element 300 may be a bipolar non-volatile memory element.

Except for the above, the first metal oxide layer 135x may be similar in configuration to the first metal oxide layer 115x of Embodiment 1, the second metal oxide layer 135y may be similar in configuration to the second metal oxide layer 115y of Embodiment 1, the third metal oxide layer 135z may be similar in configuration to the third metal oxide layer 125z of Embodiment 1, and the first metal M and the second metal N may be similar to those of Embodiment 1. Therefore, these will not be described in detail in repetition.

Specifically, for example, as the materials for the first to fourth metal oxide layers, the tantalum oxides may be used. In this case, the fourth metal oxide layer 135a may be configured such that a of $TaO_a$ is 0.96 (resistivity: 1 mΩcm), and its thickness is 10 nm. The third metal oxide layer 135z may be configured such that z of $TaO_z$ is 1.86 to 1.93 (resistivity: 40 to 100 mΩcm) and its thickness is 10 nm. The second metal oxide layer 135y may be configured such that y of $TaO_y$ is 1.29 (resistivity: 6 mΩcm) and its thickness is 10 nm. The first metal oxide layer 135x may be configured such that x of $TaO_x$ is 2.4 (resistivity: $10^7$ mΩcm) and its thickness is 5 nm.

In the present embodiment, the variable resistance layer 135 may include the first metal oxide layer 135x having a high oxygen concentration, the second metal oxide layer 135y having a low oxygen concentration, the third metal oxide layer 135z having a medium oxygen concentration, and the fourth metal oxide layer 135a having a super-low oxygen concentration.

These metal oxide layers are arranged in the following descending order of oxygen concentration: the first metal oxide layer 135x, the third metal oxide layer 135z, the second metal oxide layer 135y and the fourth metal oxide layer 135a.

In Embodiment 3, the oxygen content atomic percentage in a case where the tantalum oxide is used as the variable resistance layer, especially in conjunction with the fourth metal oxide layer 135a, will be studied. The applicant of the present application reported that in Patent literature 3 (International Publication No. 2008/059701), in a case where a tantalum oxide in an oxygen deficient state is used as a variable resistance layer which is a mono-layer, a stable operation takes place, in which a resistance value corresponding to a high-resistance state is equal to or more than five times as great as a resistance value corresponding to a low-resistance state, in a range in which x of $TaO_x$ which is the tantalum oxide is equal to or greater than 0.8 and is equal to or less than 1.9. The applicant of the present application also reported that in the above described Patent literature 1 (International Publication No. 2008/149484), a forming operation becomes unnecessary and a stable pulse operation is enabled to take place by first voltage application, by inserting into an interface region of an electrode a tantalum oxide of x≥2.1 to form a stacked-layer structure.

In light of the above, 2.1≤x may be set for $TaO_x$ constituting the first metal oxide layer 135x so that the forming operation becomes unnecessary and the redox reaction can proceed selectively. a<0.8 may be set for $TaO_a$ constituting the fourth metal oxide layer 135a so that its oxygen content is lower and the resistance change does not easily take place. In the present embodiment, even in a case where a was set to 0.96 which was greater than 0.8 in $TaO_a$ constituting the fourth metal oxide layer 135a, non-uniformity of the read currents corresponding to the low-resistance state could be lessened. However, it is considered that an aim that the resistance change is caused to take place only in a region closer to one of the electrodes can be achieved more effectively by setting a<0.8.

In Embodiment 3, the oxygen content atomic percentage in a case where the hafnium oxide is used as the variable resistance layer, especially in conjunction with the fourth metal oxide layer 135a, will be studied. The applicant of the present application reported that in Patent literature 4 (International Publication No. 2010/004705), in a case where a hafnium oxide in an oxygen deficient state is used as a variable resistance layer which is a mono-layer, resistance change occurs, in a range in which x of $HfO_x$ which is the hafnium oxide is equal to or greater than 0.9 and is equal to or less than 1.6. The applicant of the present application also reported that, a forming operation becomes unnecessary and a stable pulse operation is enabled to take place by first voltage application, by inserting into an interface region of an electrode a hafnium oxide of x>1.8 to form a stacked-layer structure.

In light of the above, 1.8<x may be set for $HfO_x$ constituting the first metal oxide layer 135x so that the forming operation becomes unnecessary and the redox reaction can proceed selectively. a<0.9 may be set for $HfO_a$ constituting the fourth metal oxide layer 135a so that its oxygen content atomic percentage is lower and the resistance change does not easily take place.

In Embodiment 3, the oxygen content atomic percentage in a case where the zirconium oxide is used as the variable resistance layer, especially in conjunction with the fourth metal oxide layer 135a, will be studied. The applicant of the present application reported that in Patent literature 5 (Japanese Laid-Open Patent Application Publication No. 2010-21381), in a case where a zirconium oxide in an oxygen deficient state is used as a variable resistance layer which is a mono-layer, resistance change occurs, in a range in which x of $ZrO_x$ which is the zirconium oxide is equal to or greater than 0.9 and is equal to or less than 1.4. The applicant of the present application also reported that, a forming operation becomes unnecessary and a stable pulse operation is enabled to take place by first voltage application, by inserting into an interface region of an electrode a zirconium oxide of x>1.9 to form a stacked-layer structure.

In light of the above, 1.9<x may be set for $ZrO_x$ constituting the first metal oxide layer 135x so that the forming operation becomes unnecessary and the redox reaction can proceed selectively. z<0.9 may be set for $ZrO_a$ constituting the fourth metal oxide layer 135a so that its oxygen content atomic percentage is lower and the resistance change does not easily take place.

With the above described configuration, the redox reaction of the first metal oxide is enabled to selectively take place in a region in the vicinity of the interface of the first electrode, and the polarity with which resistance change occurs is always stabilized. In addition, the third metal oxide layer which is higher in relative content rate of oxygen serves to suppress non-uniformity of resistances in a region which is distant from the interface of the first electrode. Since non-uniformity of read currents corresponding to the low-resistance state can be lessened, while decreasing a switching current for changing the element to the low-resistance state, a difference between the read current corresponding to the low-resistance state and a read current corresponding to the high-resistance state increases (it becomes easier to ensure a margin of reading of the current). As a result, misdetermination as to whether the element is in the low-resistance state or in the high-resistance state is less likely to occur, and hence a read error is less likely to occur.

Moreover, in the present embodiment, it becomes possible to further reduce a possibility (possibility of an incorrect operation) that the resistance change occurs in the region of the interface between the second electrode and the variable resistance layer by placing on and above the second electrode the fourth metal oxide which is lower in oxygen content atomic percentage than the third metal oxide.

The present embodiment may be combined with Embodiment 2. Specifically, the second electrode may be formed above the first electrode 106.

[Manufacturing Method]

The non-volatile memory element of Embodiment 3 can be manufactured by inserting the step of forming the fourth metal oxide layer before forming the third metal oxide layer, in the manufacturing method of Embodiment 1. The oxygen content atomic percentage or resistivity of the fourth metal oxide layer can be implemented by, for example, changing the ratio between argon gas and oxygen gas in the reactive sputtering, as in Embodiment 1.

EXAMPLES

In the present embodiment, the non-volatile memory element of Embodiment 3 was manufactured as described below.

The first electrode and the second electrode were formed by sputtering. The first electrode was formed by depositing iridium. The second electrode was formed by depositing tantalum nitride. The element was patterned by etching.

As the material of the first metal oxide layer, the second metal oxide layer, the third metal oxide layer and the fourth metal oxide layer, the tantalum oxide was used. The tantalum oxide was deposited by reactive sputtering in which sputtering was performed using a tantalum target in an atmosphere of a mixture gas of argon and oxygen.

The fourth metal oxide layer 135a was configured such that a of $TaO_a$ was 0.96 (resistivity: 1 mΩcm), and its thickness was 10 nm. The third metal oxide layer 135z was configured such that z of $TaO_z$ was 1.93 (resistivity: 100 mΩcm) and its thickness was 10 nm. The second metal oxide layer 135y was configured such that y of $TaO_y$ was 1.29 (resistivity: 6 mΩcm) and its thickness was 10 nm. The first metal oxide layer 135x was configured such that x of $TaO_x$ was 2.4 (resistivity: $10^7$ mΩcm) and its thickness was 5 nm.

The oxygen content atomic percentages and resistivities of the metal oxide layers were identified by the following method. Specifically, in a preliminary experiment, a plurality of samples which were different in flow rate of oxygen gas were created by the method of depositing the tantalum oxide layers by the reactive sputtering in which the sputtering was conducted using the tantalum target in an oxygen gas atmosphere. For each of these samples, the oxygen content atomic percentage was measured by RBS (Rutherford Backscattering Spectrometry). In addition, for each of the samples, the resistivity was measured by a four-terminal measurement method. By this method, a relationship between the oxygen flow rate during the sputtering, and the oxygen content atomic percentage and resistivity of the deposited tantalum oxide was found. With reference to the relationship, and based on the oxygen flow rates with which the first to fourth metal oxide layers comprising the tantalum oxides were deposited, the oxygen content atomic percentages and resistivities of these metal oxide layers were determined.

Figure 6:
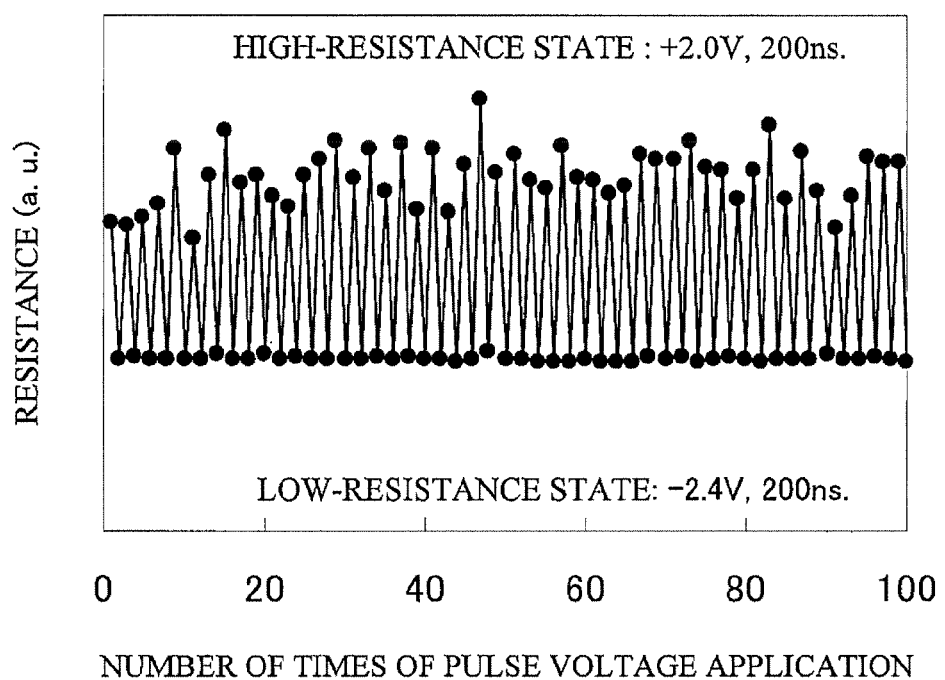
FIG. 6 is a view showing a resistance changing characteristic of a non-volatile memory element according to Example.

FIG. 6 is a view showing a resistance changing characteristic of the non-volatile memory element according to Example.

In measurement of FIG. 6, a transistor was used as the current steering (controlling) element. A gate voltage of the transistor was set to 2.4V, and the second electrode side was electrically grounded. A positive voltage (+2.0V, 200 ns) was applied to the first electrode side, thereby changing the element to the high-resistance state, while a negative voltage (−2.4V, 200 ns) was applied to the first electrode side, thereby changing the element to the low-resistance state. As shown in FIG. 6, the non-volatile memory element of Example performed a stable resistance changing operation by applying voltages which were different in polarity.

Figure 7:
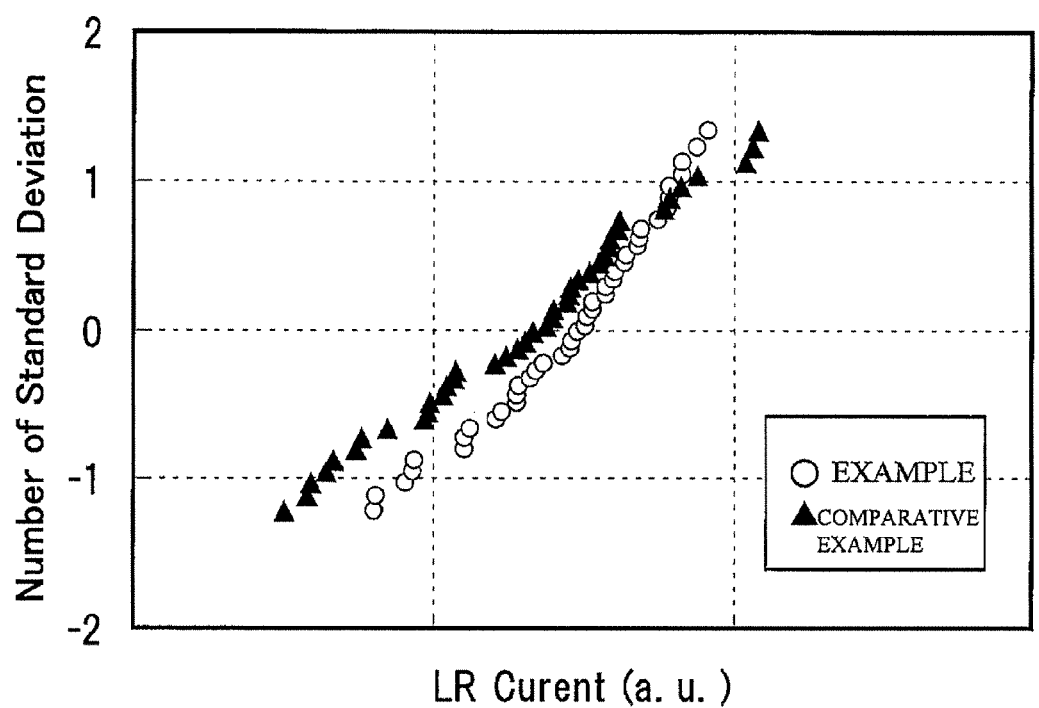
FIG. 7 is a view showing distributions of a read current corresponding to a low-resistance state, regarding non-volatile memory elements according to Example and non-volatile memory elements according to Comparative example.
Figure 8:
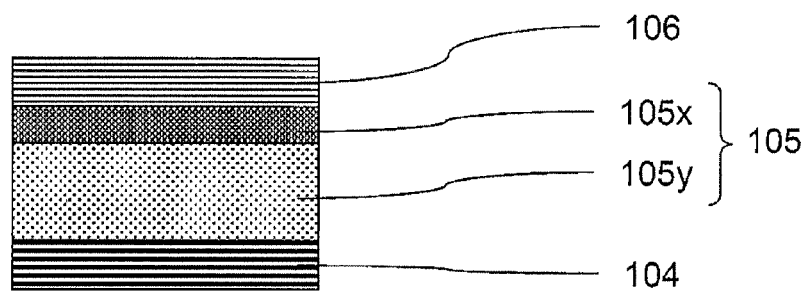
FIG. 8 is a cross-sectional view showing an exemplary schematic configuration of the non-volatile memory element according to Comparative example.

FIG. 7 is a view showing distributions of a read current corresponding to a low-resistance state, regarding non-volatile memory elements according to Example and non-volatile memory elements according to Comparative example. FIG. 8 is a cross-sectional view showing an exemplary schematic configuration of the non-volatile memory element according to Comparative example.

As shown in FIG. 8, in Comparative example, a non-volatile memory element 400 was manufactured in such a manner that the variable resistance layer 105 consisted only of two layers which were the first metal oxide layer 105x and the second metal oxide layer 105y.

The first electrode 106 and the second electrode 104 were similar in configuration to those of Example. The first metal oxide layer 105x comprised the tantalum oxide, and was configured such that x of $TaO_x$ was 2.4 (resistivity: $10^7$ mΩcm) and its thickness was 5 nm. The second metal oxide layer 105y comprised the tantalum oxide and was configured such that y of $TaO_y$ was 1.29 (resistivity: 6 mΩcm) and its thickness was 30 nm. The manufacturing method of the non-volatile memory element 400 was the same as that of Example except that the thickness of the second metal oxide layer was different.

The number of samples in Example was 50 and the number of samples in Comparative example was 50. A voltage application method was the same as that described with reference to FIG. 6, except that pulse application time was different (changing to high-resistance state: +2.0V, pulse width 50 ns, changing to low-resistance state: −2.4V, pulse width 100 ns, gate voltage of transistor: 2.4V). A voltage applied to read information was set to 0.4V.

As can be seen from FIG. 7, an average value of read currents corresponding to the low-resistance state in Example is substantially equal to that of Comparative example. However, it can be seen that non-uniformity of read currents corresponding to the low-resistance state in Example have been made less than that in Comparative example.

From the above, in the element of Example, a difference between the read current corresponding to the low-resistance state and the read current corresponding to the high-resistance state increases (it becomes easier to ensure a margin of reading of the current). As a result, misdetermination as to whether the element is in the low-resistance state or in the high-resistance state is less likely to occur, and hence a read error is less likely to occur.

[Localized Region]

Figure 9:
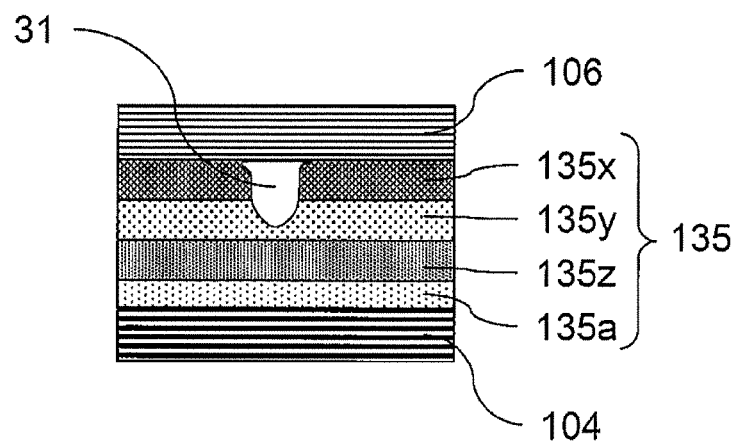
FIG. 9 is a cross-sectional view showing a localized region which is lower in oxygen content atomic percentage in the non-volatile memory element according to Embodiment 3.

FIG. 9 is a cross-sectional view showing a localized region which is lower in oxygen content atomic percentage in the non-volatile memory element according to Embodiment 3.

The variable resistance layer 135 may have a localized region 31 which is lower in oxygen content atomic percentage than the first metal oxide layer 135x, within the first metal oxide layer 135x and the second metal oxide layer 135y. This localized region may be formed by, for example, performing an initial breakdown operation in the non-volatile memory element 300. In the localized region 31, an electrically-conductive path (filament) formed by successive oxygen defects may be formed. Specifically, when a particular voltage is applied to the variable resistance layer 135, a density of oxygen defects in the localized region 31 changes by the redox reaction, and as a result, the electrically-conductive path is connected or disconnected. Thus, the resistance value of the variable resistance layer 135 may change.

The non-volatile memory element 300 may be configured such that the localized region 31 is placed in contact with the first electrode 106 and not to be in contact with the third metal oxide layer 135z, and is different in oxygen content atomic percentage from the second metal oxide layer 135y.

It is estimated that the non-uniformity of the read currents corresponding to the low-resistance state is affected by a location of the localized region 31 in the non-volatile memory element 300 and a size of the localized region 31. That is, the localized region 31 has a lower electric resistance in the state in which the non-volatile memory element 300 is in the low-resistance state. A resistance value of the non-volatile memory element 300 is approximately equal to a sum of a resistance value of the localized region 31 and a resistance value of a portion of the variable resistance layer which is present between a tip end (lower end in FIG. 9) of the localized region 31 and the second electrode 104. The change in the resistance value of the entire element is increase/decrease in the resistance value which is caused by the change in oxygen defect density in the localized region 31. Because of this, if the resistance value of the localized 31 is varied from element to element, then a changing magnitude of the resistance value of the entire element and the resistance value of the element in the low-resistance state are varied from element to element correspondingly. Conversely, if the resistance value of the localized region 31 is uniform among the elements, then a changing magnitude of the resistance value of the entire element and the resistance value of the element in the low-resistance state are uniform among the elements.

The localized region 31 is formed relatively easily in a layer which is lower in oxygen content atomic percentage, but relatively less easily in a layer which is higher in oxygen content atomic percentage. If the third metal oxide layer 135z which is higher in oxygen content atomic percentage is formed at an opposite side of the electrode (first electrode 106) which is closer to the localized region 31 such that the third metal oxide layer 135z is adjacent to the second metal oxide layer 135y which is lower in oxygen content atomic percentage, ingress of the localized region 31 from the second metal oxide layer 135y into the third metal oxide layer 135z is less likely to occur. As a result, the localized region 31 is formed only in the first metal oxide layer 135x and the second metal oxide layer 135y, which allows the localized regions 31 to have a uniform length, etc. By forming the localized regions 31 with a uniform length, etc., non-uniformity of the read currents corresponding to the low-resistance state is made less.

Modified examples of Embodiment 1 and Embodiment 2 may also be applied to Embodiment 3.

Numeral improvements and alternative embodiments of the present invention will be conceived by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

An aspect of the present invention is useful as a non-volatile memory element which is capable of lessening non-uniformity of characteristics.

REFERENCE SIGNS LIST 31 localized region
100 non-volatile memory element
104 second electrode
105 variable resistance layer
105x first metal oxide layer
105y second metal oxide layer
106 first electrode
115 variable resistance layer
115x first metal oxide layer
115y second metal oxide layer
115z third metal oxide layer
125 variable resistance layer
125x first metal oxide layer
125y second metal oxide layer
125z third metal oxide layer
135 variable resistance layer
135x first metal oxide layer
135y second metal oxide layer
135z third metal oxide layer
135a fourth metal oxide layer
200 non-volatile memory element
300 non-volatile memory element
400 non-volatile memory element

What is claimed is:

1. A non-volatile memory element comprising:
a first electrode;
a second electrode; and
a variable resistance layer which is interposed between the first electrode and the second electrode, and reversibly changes its resistance value in response to an electric signal applied between the first electrode and the second electrode;
the variable resistance layer including, when a first metal is M and a second metal is N:
a third metal oxide layer having a composition expressed as $NO_z$;
a second metal oxide layer having a composition expressed as $NO_y$; and
a first metal oxide layer having a composition expressed as $MO_x$ such that the third metal oxide layer, the second metal oxide layer and the first metal oxide layer are stacked in this order;
wherein when an oxygen content atomic percentage of an oxide of the first metal M in a stoichiometric state is A,
an oxygen content atomic percentage of an oxide of the second metal N in a stoichiometric state is B,
an oxygen content atomic percentage of $MO_x$ is C,
an oxygen content atomic percentage of $NO_y$ is D, and
an oxygen content atomic percentage of $NO_z$ is E,
$(D/B)<(C/A)$, $(E/B)<(C/A)$ and $y<z$ are satisfied.

2. The non-volatile memory element according to claim 1, wherein the composition of the third metal oxide layer and the composition of the second metal oxide layer change stepwisely between the third metal oxide layer and the second metal oxide layer.

3. The non-volatile memory element according to claim 1, wherein each of the third metal oxide layer and the second metal oxide layer has a portion in which the composition is fixed in a thickness direction thereof.

4. The non-volatile memory element according to claim 1,
wherein the first electrode and the first metal oxide layer are in contact with each other;
wherein the second electrode and the third metal oxide layer are in contact with each other;
wherein the first electrode and the second electrode comprise materials containing as major components elements which are different from each other; and
wherein a standard electrode potential V1 of the first electrode, a standard electrode potential V2 of the second electrode, and a standard electrode potential Vt1 of the metal M satisfy a relationship of $Vt1<V1$ and $V2<V1$.

5. The non-volatile memory element according to claim 1, the variable resistance layer further including:
a fourth metal oxide layer having a composition expressed as $NO_a$;
the third metal oxide layer;
the second metal oxide layer; and
the first metal oxide layer such that the fourth metal oxide layer, the third metal oxide layer, the second metal oxide layer, and the first metal oxide layer are stacked in this order;
wherein when an oxygen content atomic percentage of $NO_a$ is F, $(F/B)<(C/A)$ and $a<z$ are satisfied.

6. The non-volatile memory element according to claim 5,
wherein the first electrode and the first metal oxide layer are in contact with each other;
wherein the second electrode and the fourth metal oxide layer are in contact with each other;
wherein the first electrode and the second electrode comprise materials containing as major components elements which are different from each other; and
wherein a standard electrode potential V1 of a material constituting the first electrode, a standard electrode potential V2 of a material constituting the second electrode, and a standard electrode potential Vt1 of the metal M satisfy a relationship of $Vt1<V1$ and $V2<V1$.

7. The non-volatile memory element according to claim 1, wherein the variable resistance layer has a localized region which is lower in oxygen content atomic percentage than the first metal oxide layer, within the first metal oxide layer and the second metal oxide layer.

8. The non-volatile memory element according to claim 7,
wherein the localized region is placed in contact with the first electrode and not to be in contact with the third metal oxide layer; and
wherein the localized region is different in oxygen content atomic percentage from the second metal oxide layer.

9. The non-volatile memory element according to claim 1,
wherein the resistance value reversibly changes from a first value to a second value which is greater than the first value by application of a first electric signal between the first electrode and the second electrode; and
wherein the resistance value reversibly changes from the second value to the first value by application of a second electric signal between the first electrode and the second electrode, the second electric signal being different in polarity from the first electric signal.

10. The non-volatile memory element according to claim 1, wherein the metal M and the metal N are an identical element.

11. The non-volatile memory element according to claim 5, wherein the metal M and the metal N are tantalum, and the composition $TaO_x$ of the first metal oxide layer satisfies $2.1 \leq x$, and the composition $TaO_a$ of the fourth metal oxide layer satisfies $a<0.8$.

* * * * *